US012681344B2

(12) United States Patent
Chuang et al.

(10) Patent No.: US 12,681,344 B2
(45) Date of Patent: Jul. 14, 2026

(54) PHOTODETECTORS INTEGRATED INTO THIN-FILM TRANSISTOR BACKPLANES

(71) Applicant: Apple Inc., Cupertino, CA (US)

(72) Inventors: Ching-Sang Chuang, Sunnyvale, CA (US); Jiun-Jye Chang, Cupertino, CA (US); Po-Chun Yeh, Cupertino, CA (US); Shih Chang Chang, Cupertino, CA (US); Ting-Kuo Chang, San Jose, CA (US); Yun Wang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 1078 days.

(21) Appl. No.: 16/945,643

(22) Filed: Jul. 31, 2020

(65) Prior Publication Data

US 2021/0050385 A1 Feb. 18, 2021

Related U.S. Application Data

(60) Provisional application No. 62/886,258, filed on Aug. 13, 2019.

(51) Int. Cl.
　*G02F 1/133* (2006.01)
　*G02F 1/1333* (2006.01)
　(Continued)

(52) U.S. Cl.
　CPC .... *G02F 1/13318* (2013.01); *G02F 1/133308* (2013.01); *G02F 1/13338* (2013.01);
　(Continued)

(58) Field of Classification Search
　CPC ............... H01L 27/307; H01L 27/1461; H01L 27/14616; H01L 27/14678; H01L 27/288;
　(Continued)

(56) References Cited

U.S. PATENT DOCUMENTS 5,231,689 A 7/1993 Reidinger
6,349,159 B1 2/2002 Uebbing et al.
　(Continued)

FOREIGN PATENT DOCUMENTS

CN 105531653 4/2016
CN 107180853 9/2017
　(Continued)

OTHER PUBLICATIONS

Gelinck et al., "X-Ray Detector-on-Plastic With High Sensitivity Using Low Cost, Solution-Processed Organic Photodiodes," IEEE, 2015, pp. 1-8.

(Continued)

*Primary Examiner* — Charles S Chang
(74) *Attorney, Agent, or Firm* — Brownstein Hyatt Farber Schreck, LLP

(57) ABSTRACT

An electronic device includes a stack, and the stack includes a substrate, and a multi-layer structure deposited on the substrate and including a set of TFTs. The electronic device further includes a photodetector attached to the multi-layer structure and including an organic photosensitive material. The organic photosensitive material is electrically connected to a TFT in the set of TFTs. Another electronic device includes a stack, and the stack includes a substrate, and a multi-layer structure deposited on the substrate. The multi-layer structure includes a first set of layers including a set of TFTs, and a second set of layers including a PIN diode. The PIN diode is configured to operate as a photodetector and receive at least one wavelength of electromagnetic radiation, and is electrically connected to a TFT in the set of TFTs.

14 Claims, 20 Drawing Sheets

(51) Int. Cl.

| | |
|---|---|
| *G02F 1/1343* | (2006.01) |
| *G02F 1/1368* | (2006.01) |
| *H10D 30/67* | (2025.01) |
| *H10F 39/00* | (2025.01) |
| *H10F 39/12* | (2025.01) |
| *H10K 39/32* | (2023.01) |
| *H10K 59/12* | (2023.01) |
| *H10K 59/121* | (2023.01) |
| *H10K 59/65* | (2023.01) |
| *H10K 59/80* | (2023.01) |
| *H10K 65/00* | (2023.01) |
| *H10K 77/10* | (2023.01) |
| *H10K 102/00* | (2023.01) |

(52) U.S. Cl.
CPC .... *G02F 1/134309* (2013.01); *G02F 1/13439* (2013.01); *G02F 1/1368* (2013.01); *H10D 30/6731* (2025.01); *H10D 30/6745* (2025.01); *H10D 30/6755* (2025.01); *H10F 39/198* (2025.01); *H10F 39/8033* (2025.01); *H10F 39/80377* (2025.01); *H10K 39/32* (2023.02); *H10K 59/12* (2023.02); *H10K 59/1213* (2023.02); *H10K 59/65* (2023.02); *H10K 59/871* (2023.02); *H10K 65/00* (2023.02); *H10K 77/111* (2023.02); *G02F 1/133331* (2021.01); *G02F 1/133357* (2021.01); *H10K 2102/3026* (2023.02); *H10K 2102/311* (2023.02)

(58) Field of Classification Search
CPC ............. H01L 27/3234; H01L 27/3262; H01L 29/78675; H01L 29/7869; H01L 51/0097; H01L 51/524; H01L 2251/5315; H01L 2251/5338; G02F 1/133308; G02F 1/13338; G02F 1/134309; G02F 1/13439; G02F 1/1368; G02F 1/133331; G02F 1/133357
See application file for complete search history.

(56) References Cited

U.S. PATENT DOCUMENTS

| | | | |
|---|---|---|---|
| 6,529,661 | B2 | 3/2003 | Kropp |
| 6,556,349 | B2 | 4/2003 | Cox et al. |
| 6,586,776 | B1 | 7/2003 | Liu |
| 6,910,812 | B2 | 6/2005 | Pommer |
| 6,919,681 | B2 | 7/2005 | Cok et al. |
| 6,946,647 | B1 | 9/2005 | O'Neill et al. |
| 6,948,820 | B2 | 9/2005 | Veligdan et al. |
| 7,021,833 | B2 | 4/2006 | Loh |
| 7,071,615 | B2 | 7/2006 | Lu et al. |
| 7,444,083 | B2 | 10/2008 | Ohashi et al. |
| 7,495,272 | B2 * | 2/2009 | Maruyama ........ H01L 27/14609 |
| | | | 257/292 |
| 7,499,094 | B2 | 3/2009 | Kuriyama |
| 7,518,462 | B2 | 4/2009 | Kanno et al. |
| 7,540,645 | B2 | 6/2009 | Kazakevich |
| 7,706,073 | B2 | 4/2010 | Munro |
| 7,712,906 | B1 | 5/2010 | Larimer |
| RE41,673 | E | 9/2010 | Ma |
| 7,842,246 | B2 | 11/2010 | Wohlstadter et al. |
| 8,077,393 | B2 | 12/2011 | Steenblik |
| 8,305,400 | B2 | 11/2012 | Otani |
| 8,603,642 | B2 | 12/2013 | Hatwar et al. |
| 8,624,853 | B2 | 1/2014 | Han et al. |
| 8,664,655 | B2 | 3/2014 | Lee et al. |
| 8,743,027 | B2 | 6/2014 | Wu et al. |
| 8,780,065 | B2 | 7/2014 | Ribeiro et al. |
| 9,007,349 | B2 | 4/2015 | Tseng |
| 9,064,451 | B2 | 6/2015 | Lynch et al. |
| 9,070,648 | B2 | 6/2015 | de Jong et al. |

| | | | |
|---|---|---|---|
| 9,112,043 | B2 | 8/2015 | Arai |
| 9,183,779 | B2 | 11/2015 | Soto |
| 9,342,181 | B2 | 5/2016 | Wyatt et al. |
| 9,431,621 | B2 | 8/2016 | Forrest et al. |
| 9,530,381 | B1 | 12/2016 | Bozarth et al. |
| 9,570,002 | B2 | 2/2017 | Sakariya et al. |
| 9,614,168 | B2 | 4/2017 | Zhang et al. |
| 9,633,247 | B2 | 4/2017 | Pope et al. |
| 9,741,286 | B2 | 8/2017 | Sakariya et al. |
| 9,762,329 | B2 | 9/2017 | Motohara |
| 9,836,165 | B2 | 12/2017 | Nho et al. |
| 9,870,075 | B2 | 1/2018 | Han et al. |
| 9,909,862 | B2 | 3/2018 | Ansari et al. |
| 9,947,901 | B2 | 4/2018 | Shedletsky et al. |
| 10,033,948 | B2 | 7/2018 | Rephaeli et al. |
| 10,073,228 | B2 | 9/2018 | Polleux et al. |
| 10,079,001 | B2 | 9/2018 | Hodges |
| 10,090,574 | B2 | 10/2018 | Wu |
| 10,115,000 | B2 | 10/2018 | Mackey et al. |
| 10,115,777 | B2 | 10/2018 | Tanaka et al. |
| 10,222,475 | B2 | 3/2019 | Pacala |
| 10,290,266 | B2 | 5/2019 | Kurokawa |
| 10,331,939 | B2 | 6/2019 | He et al. |
| 10,345,905 | B2 | 7/2019 | McClure et al. |
| 10,410,036 | B2 | 9/2019 | He et al. |
| 10,410,037 | B2 | 9/2019 | He et al. |
| 10,453,381 | B2 | 10/2019 | Kurokawa |
| 10,474,286 | B2 | 11/2019 | Bae et al. |
| 10,526,757 | B2 | 1/2020 | Lee et al. |
| 10,565,734 | B2 | 2/2020 | Bevensee et al. |
| 10,614,279 | B2 | 4/2020 | Kim et al. |
| 10,637,008 | B2 | 4/2020 | Harada et al. |
| 10,664,680 | B2 | 5/2020 | Xu et al. |
| 10,670,790 | B2 | 6/2020 | Braithwaite |
| 10,713,458 | B2 | 7/2020 | Bhat et al. |
| 10,727,285 | B2 | 7/2020 | Chung et al. |
| 10,748,476 | B2 | 8/2020 | Zhao et al. |
| 10,809,853 | B2 | 10/2020 | Klenkler et al. |
| 10,838,556 | B2 | 11/2020 | Yeke Yazdandoost et al. |
| 10,872,222 | B2 | 12/2020 | Gao et al. |
| 10,903,901 | B2 | 1/2021 | Mitchell |
| 10,950,592 | B2 | 3/2021 | Ding et al. |
| 10,976,416 | B2 | 4/2021 | Park et al. |
| 10,978,523 | B2 | 4/2021 | Park et al. |
| 10,989,846 | B2 | 4/2021 | Hitomi et al. |
| 11,041,713 | B2 | 6/2021 | Han et al. |
| 11,158,258 | B2 | 10/2021 | Cha et al. |
| 11,233,100 | B2 | 1/2022 | Feng et al. |
| 11,394,014 | B2 | 7/2022 | Kubota et al. |
| 11,469,573 | B2 | 10/2022 | Lyon et al. |
| 11,527,582 | B1 | 12/2022 | Ran et al. |
| 11,543,919 | B2 | 1/2023 | Han et al. |
| 2003/0148391 | A1 | 8/2003 | Salafsky |
| 2004/0067324 | A1 | 4/2004 | Lazarev et al. |
| 2004/0209116 | A1 | 10/2004 | Ren et al. |
| 2005/0094931 | A1 | 5/2005 | Yokoyama et al. |
| 2007/0241998 | A1 * | 10/2007 | Fish .................... H10K 50/824 |
| | | | 257/E23.114 |
| 2011/0043735 | A1 * | 2/2011 | Kozuma ................. G01J 3/513 |
| | | | 250/226 |
| 2011/0175086 | A1 * | 7/2011 | Katoh ................ H10F 30/2235 |
| | | | 257/53 |
| 2011/0176086 | A1 | 7/2011 | Katoh et al. |
| 2012/0092302 | A1 * | 4/2012 | Imai .................. H01L 31/03682 |
| | | | 345/175 |
| 2012/0113357 | A1 | 5/2012 | Cheng et al. |
| 2013/0113733 | A1 | 5/2013 | Lim et al. |
| 2014/0044392 | A1 | 2/2014 | Fattal et al. |
| 2015/0309385 | A1 | 10/2015 | Shu et al. |
| 2016/0103359 | A1 * | 4/2016 | Kimura .................. G06F 3/042 |
| | | | 349/33 |
| 2017/0242506 | A1 | 8/2017 | Patel et al. |
| 2017/0270342 | A1 | 9/2017 | He et al. |
| 2018/0032778 | A1 | 2/2018 | Lang |
| 2018/0102491 | A1 * | 4/2018 | Hou .................... H10K 30/87 |
| 2018/0210571 | A1 * | 7/2018 | Wang .................... H10K 59/13 |
| 2018/0323243 | A1 | 11/2018 | Wang |
| 2019/0013368 | A1 | 1/2019 | Chung et al. |
| 2019/0034686 | A1 | 1/2019 | Ling et al. |

(56) References Cited

U.S. PATENT DOCUMENTS

| | | | |
|---|---|---|---|
| 2019/0130155 A1 | 5/2019 | Park | |
| 2019/0221624 A1 | 7/2019 | Lin et al. | |
| 2019/0293849 A1 | 9/2019 | Du et al. | |
| 2020/0051499 A1 | 2/2020 | Chung et al. | |
| 2020/0105851 A1* | 4/2020 | Yazdandoost | G01J 1/4204 |
| 2020/0174163 A1 | 6/2020 | Han et al. | |
| 2020/0209729 A1 | 7/2020 | Chen et al. | |
| 2020/0241138 A1 | 7/2020 | Allen et al. | |
| 2020/0265206 A1 | 8/2020 | Chung et al. | |
| 2020/0293741 A1 | 9/2020 | Du | |
| 2020/0342194 A1 | 10/2020 | Bhat et al. | |
| 2021/0005669 A1 | 1/2021 | Kamada et al. | |
| 2021/0014429 A1 | 1/2021 | Alasirnio et al. | |
| 2021/0064159 A1 | 3/2021 | Yeke Yazdandoost et al. | |
| 2021/0089741 A1 | 3/2021 | Yeh et al. | |
| 2021/0091342 A1 | 3/2021 | Chen et al. | |
| 2021/0103075 A1 | 4/2021 | Park et al. | |
| 2021/0255668 A1 | 8/2021 | Xiang et al. | |
| 2021/0287602 A1 | 9/2021 | Chen et al. | |
| 2021/0296409 A1 | 9/2021 | Yamazaki et al. | |
| 2021/0396935 A1 | 12/2021 | Chen et al. | |
| 2022/0035200 A1 | 2/2022 | Chen et al. | |
| 2022/0158141 A1 | 5/2022 | Yuki et al. | |
| 2022/0293682 A1 | 9/2022 | Einzinger et al. | |
| 2023/0034270 A1 | 2/2023 | Medower et al. | |
| 2023/0070943 A1 | 3/2023 | Vulis et al. | |
| 2023/0111407 A1 | 4/2023 | Ran et al. | |

FOREIGN PATENT DOCUMENTS

| | | |
|---|---|---|
| CN | 107271404 | 10/2017 |
| CN | 107330426 | 11/2017 |
| CN | 107515435 | 12/2017 |
| CN | 108292361 | 7/2018 |
| CN | 108885693 | 11/2018 |
| CN | 109074475 | 12/2018 |
| CN | 109791325 | 5/2019 |
| CN | 109983471 | 7/2019 |
| CN | 110488315 | 11/2019 |
| CN | 112505808 | 3/2021 |
| DE | 202004002512 | 3/2005 |
| EP | 2463927 | 8/2013 |
| EP | 3171254 | 5/2017 |
| EP | 3404484 | 11/2018 |
| EP | 3438880 | 2/2019 |
| EP | 3576154 | 12/2019 |
| JP | H0642898 | 2/1994 |
| JP | 1997152840 | 6/1997 |
| JP | 2001021992 | 1/2001 |
| JP | 2010231937 | 10/2010 |
| JP | 2014207446 | 10/2014 |
| JP | 2015045708 | 3/2015 |
| JP | 2016-503516 | 2/2016 |
| JP | 6127447 | 5/2017 |
| JP | 2018537804 | 12/2018 |
| KR | 200312616 | 5/2003 |
| KR | 20050022260 | 3/2005 |
| WO | WO 10/029542 | 3/2010 |
| WO | WO 17/204777 | 11/2017 |
| WO | WO 18/093798 | 5/2018 |
| WO | WO 18/186580 | 10/2018 |
| WO | WO 18/210317 | 11/2018 |

OTHER PUBLICATIONS

Garcia de Arquer et al., "Solution-processed semiconductors for next-generation photodetectors," *Nature Reviews—Materials*, 2017, vol. 2, No. 16100, pp. 1-16.

U.S. Appl. No. 16/945,174, filed Jul. 31, 2020, Chen et al.

U.S. Appl. No. 17/003,636, filed Aug. 26, 2020, Yeh et al.

U.S. Appl. No. 17/003,732, filed Aug. 26, 2020, Chen et al.

U.S. Appl. No. 17/006,708, filed Aug. 28, 2020, Ran et al.

U.S. Appl. No. 17/200,683, filed Mar. 12, 2021, Einzinger et al.

U.S. Appl. No. 16/376,987, filed Apr. 5, 2019, Yeke Yazandoost et al.

U.S. Appl. No. 16/723,850, filed Dec. 20, 2019, Chen et al.

U.S. Appl. No. 16/791,905, filed Feb. 14, 2020, Xiang.

U.S. Appl. No. 16/815,875, filed Mar. 11, 2020, Chen et al.

U.S. Appl. No. 16/905,664, filed Jun. 18, 2020, Chen et al.

U.S. Appl. No. 17/028,775, filed Sep. 22, 2020, Yeke Yazdandoost et al.

U.S. Appl. No. 17/865,169, filed Jul. 14, 2022, Medower et al.

Byrnes et al., "Designing large, high-efficiency, high-numerical-aperture, transmissive meta-lenses for visible light," Optics Express, vol. 24, No. 5, Mar. 7, 2016, 15 pages.

* cited by examiner

100

100

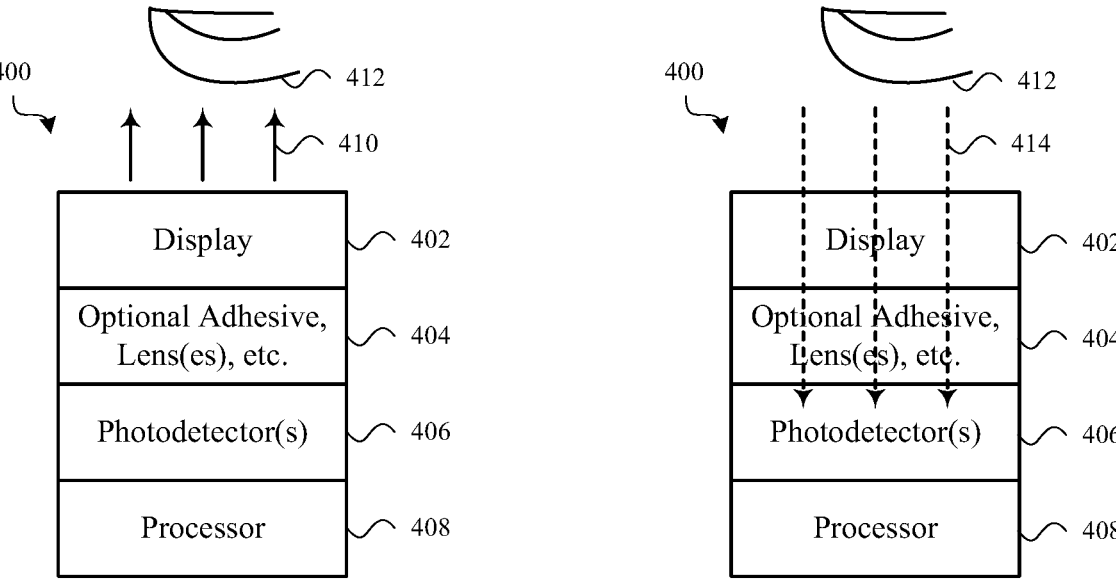
FIG. 4A
FIG. 4B
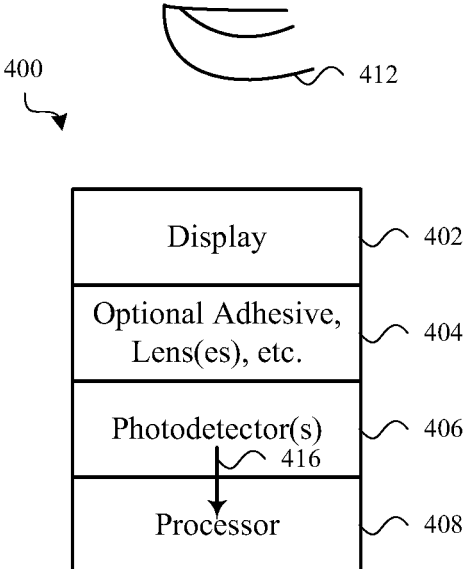
FIG. 4C

700
708
706
710
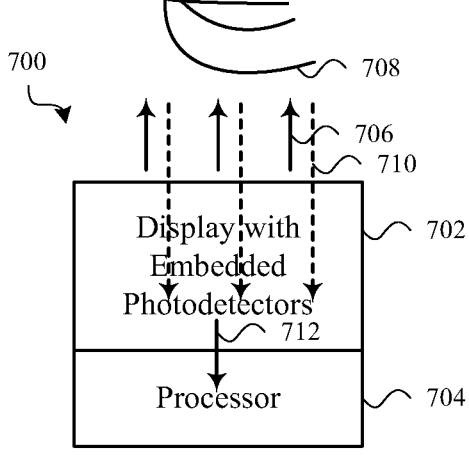
Display with
Embedded
Photodetectors          702
712
Processor          704
FIG. 7
800
| Thin-Film Encapsulation | 810 |
|---|---|
| Organic Light-Emitting Material | 808 |
| Organic Photosensitive Material | 806 |
| Multi-Layer Structure (TFTs) | 804 |
| Substrate | 802 |
FIG. 8

PHOTODETECTORS INTEGRATED INTO THIN-FILM TRANSISTOR BACKPLANES

CROSS-REFERENCE TO RELATED APPLICATION

This application is a nonprovisional of and claims the benefit under 35 U.S.C. § 119(e) of U.S. Provisional Patent Application No. 62/886,258, filed Aug. 13, 2019, the contents of which are incorporated herein by reference as if fully disclosed herein.

FIELD

The described embodiments generally relate to devices that include one or more photodetectors, such as biometric sensors, cameras, depth sensors, and so on. More particularly, the described embodiments relate to the positioning of such sensors behind a display.

BACKGROUND

Sensors are included in many of today's electronic devices, including electronic devices such as smartphones, computers (e.g., tablet computers or laptop computers), wearable electronic devices (e.g., electronic watches, smart watches, or health monitors), game controllers, navigation systems (e.g., vehicle navigation systems or robot navigation systems), and so on. Sensors may variously sense the presence of objects, distances to objects, proximities of objects, movements of objects (e.g., whether objects are moving, or the speed, acceleration, or direction of movement of objects), and so on. Some sensors may include a photodetector, or an array of photodetectors. A photodetector or array of photodetectors may be used, for example, to determine a proximity of an object. An array of photodetectors may be variously configured as a biometric sensor, camera, or depth sensor, for example, and may be used to generate an image (a 2D image), a depth map (a 3D image), or a video clip (a sequence of 2D or 3D images).

Given the wide range of sensor applications, any new development in the configuration or operation of a system including a sensor can be useful. New developments that may be particularly useful are developments that reduce the cost, size, complexity, part count, or manufacture time of the sensor or sensor system, or developments that improve the sensitivity or speed of sensor or sensor system operation.

SUMMARY

Embodiments of the systems, devices, methods, and apparatus described in the present disclosure are directed to the integration of a photodetector, or an array of photodetectors, into a thin-film transistor (TFT) backplane. The TFT backplane including the photodetector or array of photodetectors may in some cases be positioned behind a display, and in some cases may be attached to the display. Alternatively, the TFT backplane including the photodetector or array of photodetectors may be the same TFT backplane that is used to support the display (e.g., the photodetector(s) and light-emitting elements of the display, and control circuitry for the photodetector(s) and light-emitting elements of the display, may be integrated into the same TFT backplane). In some cases, the TFT backplane may be constructed as a Low-Temperature Polycrystalline Oxide (LTPO) backplane.

In a first aspect, the present disclosure describes an electronic device. The electronic device may include a stack, and the stack may include: a substrate, and a multi-layer structure deposited on the substrate. The multi-layer structure may include a set of TFTs. The electronic device may further include a photodetector attached to the multi-layer structure. The photodetector may include an organic photosensitive material. The organic photosensitive material may be electrically connected to a TFT in the set of TFTs.

In a second aspect, the present disclosure describes another electronic device. The device may include a housing that defines part of an interior volume and an opening to the interior volume; a cover mounted to the housing to cover the opening and further define the interior volume; and a display stack mounted within the interior volume and viewable through the cover. The display stack may include a TFT display backplane formed on a flexible substrate; an array of light-emitting pixels, disposed between the cover and the TFT display backplane and electrically connected to the TFT display backplane; and a photodetector formed in the TFT display backplane.

In a third aspect, the present disclosure describes yet another electronic device. The electronic device may include a stack, and the stack may include: a substrate, and a multi-layer structure deposited on the substrate. The multi-layer structure may include a first set of layers including a set of TFTs, and a second set of layers including a PIN diode. The PIN diode may be configured to operate as a photodetector and receive at least one wavelength of electromagnetic radiation, and may be electrically connected to a TFT in the set of TFTs.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which:

FIGS. 4A-4C show a first example configuration of the stack (a device stack, or display stack) described with reference to FIGS. 1A-1B, 2A-2B, and 3;

FIG. 7 shows a second example configuration of the stack (a device stack, or display stack) described with reference to FIGS. 1A-1B and 3;

FIG. 8 shows an example layer structure for a display with an array of embedded photodetectors (or photodetector), such as the display described with reference to FIG. 7;

FIG. 13 shows current flow through the photodetector, readout transistor, and gate-in-panel (GIP) transistor described with reference to FIGS. 11A-12B, as the various devices are switched from OFF to ON.

Figure 1A:
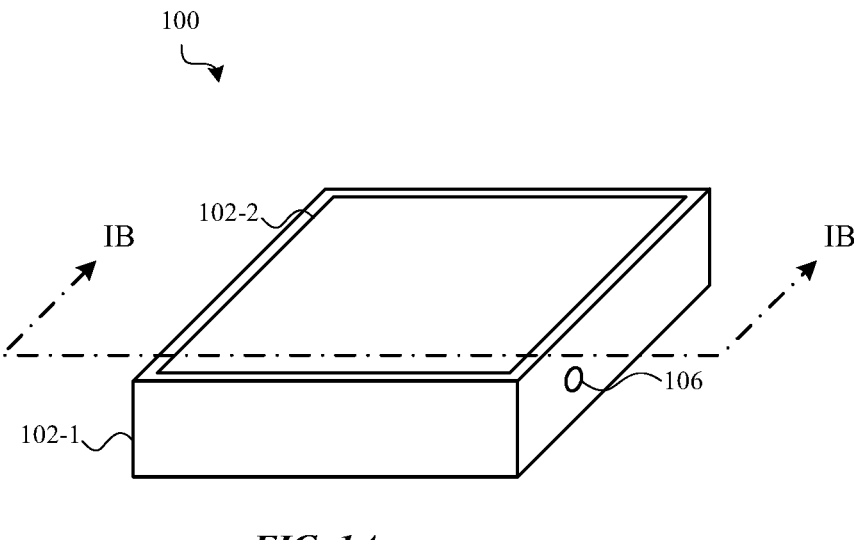
FIGS. 1A and 1B show an example of a device that may include an array of photodetectors.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

The following description relates to integrating a photodetector, or an array of photodetectors, into a TFT backplane, such as an LTPO backplane. An array of photodetectors integrated into a TFT backplane may be variously configured as a biometric sensor, a camera, a depth sensor, and so on. In some embodiments, a sensor module including the photodetector(s) integrated into the TFT backplane may be positioned behind a display. In some cases, the sensor module may be attached to the back of the display. The backplane for the display may be constructed similarly to the backplane in which the photodetector(s) are integrated (e.g., as a TFT backplane and, in some cases, as an LTPO backplane). Alternatively, the photodetector(s) may be integrated into a TFT display backplane, with the photodetector(s) and light-emitting elements of the display sharing the same TFT backplane.

A sensor including an array of photodetectors integrated into a TFT backplane can be scaled more effectively, and at lower cost, than a complementary metal-oxide semiconductor (CMOS) sensor constructed on a semiconductor wafer (e.g., a silicon wafer). For example, an array of photodetectors integrated into a TFT backplane may span the entire area covered by a display, or may be shaped in arbitrary ways, or may be non-planar (e.g., because the TFT backplane into which the photodetectors are integrated may be flexible).

The photodetector(s) integrated into a TFT backplane may in some cases take the form of avalanche photodiodes (APDs). The photodetector(s) may also or alternatively include organic photosensitive material. In some cases, the photodetector(s) may take the form of organic avalanche photodiodes (O-APDs). In some cases, the photodetector(s) may include micro-cavities formed via photolithography patterning on an organic photodiode, or on any planarization layer including an organic photosensitive material, to enhance the transmission of electromagnetic radiation and transform received electromagnetic radiation into an electrical signal. Alternatively, the photodetector(s) may take the form of PIN diodes.

An array of photodetectors may be used, for example, for security, health monitoring, or entertainment purposes. For example, when used for security purposes, an array of photodetectors may be used to obtain biometric information, such as fingerprints, palm-prints, 3D face scans, or retina scans. The biometric information may then be used to identify or authenticate a user. When used for health monitoring purposes, an array of photodetectors may be used, for example, to acquire an electrocardiogram (ECG), pulse, or ophthalmic scan from a user. When used for entertainment purposes, an array of photodetectors may be used, for example, for palm reading, social networking, or social matching.

These and other techniques are described with reference to FIGS. 1A-14. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "beneath", "left", "right", etc. may be used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways. The use of alternative terminology, such as "or", is intended to indicate different combinations of the alternative elements. For example, A or B is intended to include, A, or B, or A and B.

Figure 1B:
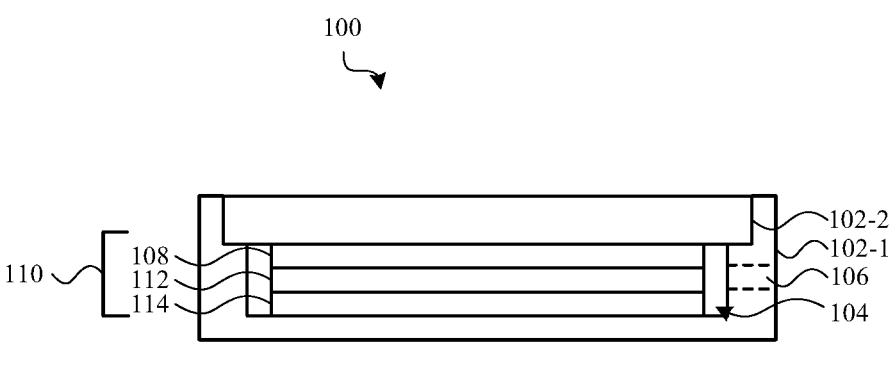

FIGS. 1A and 1B show an example of a device 100 that may include an array of photodetectors. The device 100 may include a housing 102 that defines an interior volume 104. FIG. 1A shows an isometric view of the device 100, and FIG. 1B shows a cross-section of the device 100 along line IB-IB.

The housing 102 may include, for example, a frame 102-1 and a cover 102-2. Each component of the housing (e.g., each of the frame 102-1 and the cover 102-2) may define a part of the interior volume 104. The frame 102-1 may further define an opening to the interior volume 104. In some cases, the frame 102-1 may be a multi-part frame, such as a frame formed by a support plate and one or more edge members extending from the support plate to support the cover 102-2. In some cases, the edge members may define a sidewall of the device 100. In some cases, the frame 102-1 may include metal and/or plastic components. In some cases, the cover 102-2 may be a transparent cover, such as a glass, sapphire, or plastic cover. The components of the housing 102 may be semi-permanently or detachably joined to one another by a set of fasteners, adhesives, seals, or other components. In some cases, the housing 102 may include different or additional components.

In some embodiments, the interior volume 104 may be sealed to prevent gases (e.g., air) or fluids (e.g., water) from entering or leaving the interior volume 104. In other embodiments, the interior volume 104 may not be sealed, thereby allowing gases and possibly fluids to enter or leave the interior volume 104. In some embodiments, the interior volume 104 may be vented. For example, an optional port 106 may be defined in frame 102-1 or another portion of the housing 102, and the port 106 may allow gases (e.g., air) but not fluids (e.g., water) to flow between the interior volume 104 and an ambient environment of the device 100.

As shown in FIG. 1B, a display 108 (i.e., an electronic display) may be disposed within the interior volume 104 and configured to emit or project light (e.g., light that defines an image) through the cover 102-2. The display 108 may be partially or completely surrounded by the frame 102-1 or cover 102-2, and in some cases may be mounted to the frame 102-1 and/or the cover 102-2. The display 108 may include one or more light-emitting pixels or elements, and in some cases may be a light-emitting diode (LED) display, an organic light-emitting diode (OLED) display, a liquid crystal display (LCD), an electroluminescent (EL) display, a laser projector, or another type of electronic display.

In some embodiments, a stack 110 (or display stack, or device stack) including the display 108 may include, or be associated with, one or more touch and/or force sensors that are configured to detect a touch and/or force applied to an exterior surface of the cover 102-2. For example, the stack 110 may include a touch sensing system, and the touch sensing system may include, for example, a set of capacitive touch sensing elements, a set of resistive touch sensing elements, or a set of ultrasonic touch sensing elements. When a user of the device 100 touches the cover 102-2, the touch sensing system (or touch sensor) may detect one or more touches on the cover 102-2 and indicate the locations of the touches on the cover 102-2. The touches may include, for example, touches by a user's finger or stylus.

The stack 110 may also include a force sensing system, and the force sensing system may include, for example, a set of capacitive force sensing elements, a set of resistive force sensing elements, or one or more pressure transducers. When a user of the device 100 presses on the cover 102-2 (i.e., applies a force to the cover 102-2), the force sensing system may determine an amount of force applied to the cover 102-2 (or in some cases, the amount of force applied to a side or sides of the frame 102-1, a surface of the frame 102-1 opposite the cover 102-2, and so on). In some embodiments, the force sensing system may be used alone or in combination with the touch sensing system to determine a location of an applied force, or an amount of force associated with each touch in a set of multiple contemporaneous touches.

As also shown in FIG. 1B, an array of photodetectors 112 (or at least one photodetector), a processor 114, and/or other components may also be positioned partly or wholly within the interior volume 104. The array of photodetectors 112 and/or processor 114 may be mounted to the frame 102-1 and/or the cover 102-2, and in some cases may be included in the stack 110. Some of the components (e.g., the processor 114) may alternatively be positioned entirely outside the interior volume 104, such as below a support plate or mid-plate of the frame 102-1 (not shown).

The processor 114 may be configured to operate the display 108, a touch sensing system, a force sensing system, and/or the array of photodetectors 112, and may be configured to receive, evaluate, propagate, or respond to signals obtained from the touch sensing system, force sensing system, and/or array of photodetectors 112.

In some embodiments, the array of photodetectors 112 may be variously configured as a biometric sensor, a camera, a depth sensor, and so on. The array of photodetectors 112 may also function as a proximity sensor. Although the array of photodetectors 112 is shown positioned behind the display 108, the array of photodetectors 112 may alternatively be integrated with the display 108.

Figure 2A:
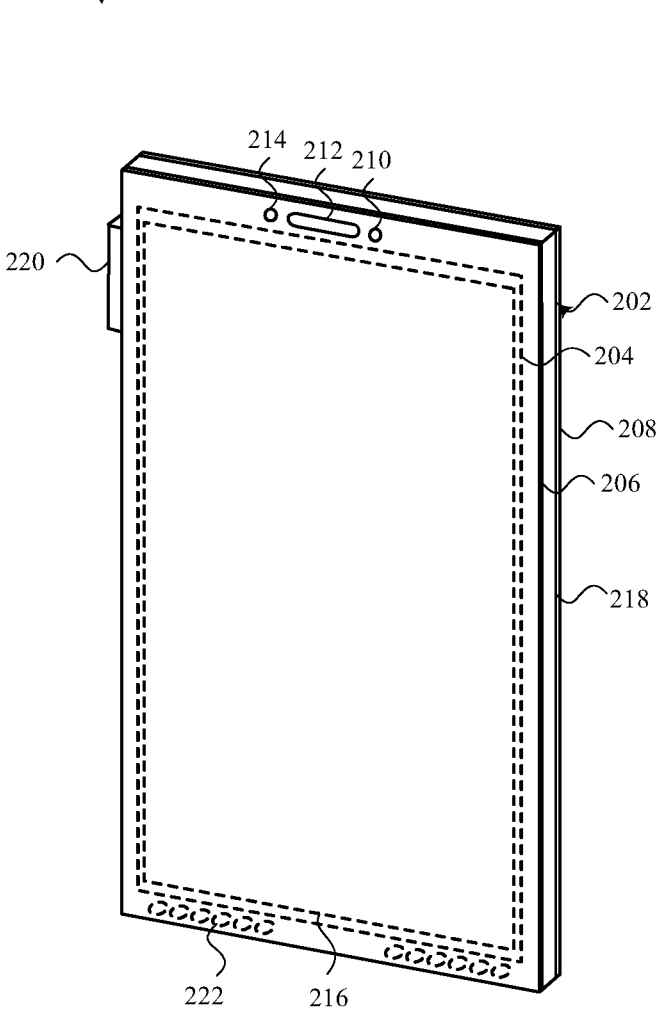
FIGS. 2A and 2B show another example of a device that may include an array of photodetectors.
Figure 2B:
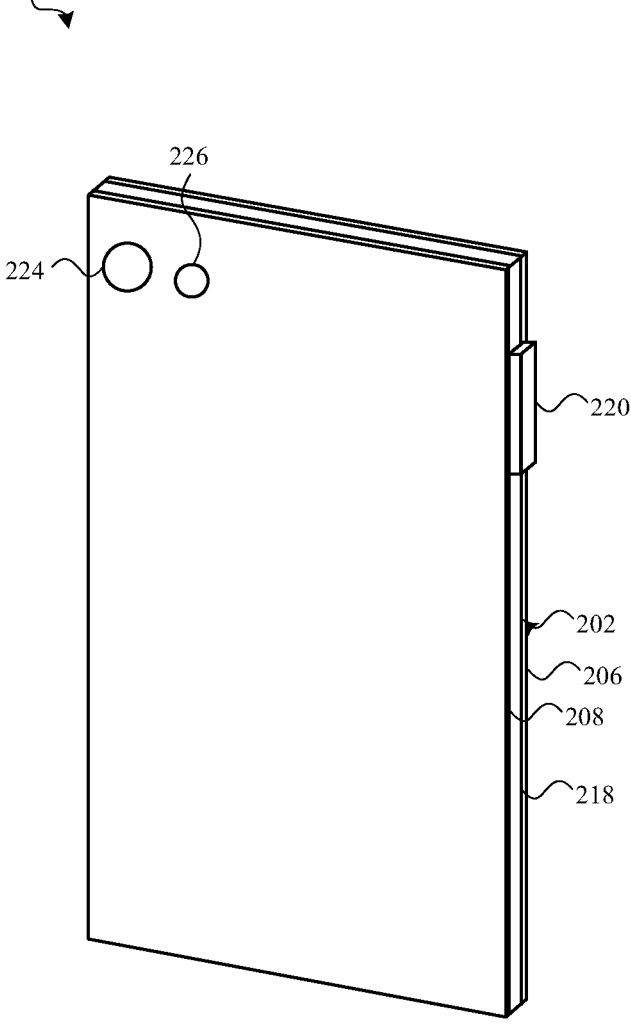

FIGS. 2A and 2B show another example of a device that may include an array of photodetectors. The device's dimensions and form factor, including the ratio of the length of its long sides to the length of its short sides, suggest that the device 200 is a mobile phone (e.g., a smartphone). However, the device's dimensions and form factor are arbitrarily chosen, and the device 200 could alternatively be any portable electronic device including, for example a mobile phone, tablet computer, portable computer, portable music player, electronic watch, health monitoring device, portable terminal, vehicle navigation system, robot navigation system, or other portable or mobile device. The device 200 could also be a device that is semi-permanently located (or installed) at a single location (e.g., a door lock, thermostat, refrigerator, or other appliance). FIG. 2A shows a front isometric view of the device 200, and FIG. 2B shows a rear isometric view of the device 200. The device 200 may include a housing 202 that at least partially surrounds a display 204. The housing 202 may include or support a front cover 206 or a rear cover 208. The front cover 206 may be positioned over the display 204, and may provide a window through which the display 204 may be viewed. In some embodiments, the display 204 may be attached to (or abut) the housing 202 and/or the front cover 206. In alternative embodiments of the device 200, the display 204 may not be included and/or the housing 202 may have an alternative configuration.

The display 204 may include one or more light-emitting pixels or elements, and in some cases may be an LED display, an OLED display, an LCD, an EL display, a laser projector, or another type of electronic display. In some embodiments, the display 204 may include, or be associated with, one or more touch and/or force sensors that are configured to detect a touch and/or a force applied to a surface of the front cover 206.

The various components of the housing 202 may be formed from the same or different materials. For example, a sidewall 218 of the housing 202 may be formed using one or more metals (e.g., stainless steel), polymers (e.g., plastics), ceramics, or composites (e.g., carbon fiber). In some cases, the sidewall 218 may be a multi-segment sidewall including a set of antennas. The antennas may form structural components of the sidewall 218. The antennas may be structurally coupled (to one another or to other components) and electrically isolated (from each other or from other components) by one or more non-conductive segments of the sidewall 218. The front cover 206 may be formed, for example, using one or more of glass, a crystal (e.g., sapphire), or a transparent polymer (e.g., plastic) that enables a user to view the display 204 through the front cover 206. In some cases, a portion of the front cover 206 (e.g., a perimeter portion of the front cover 206) may be coated with an opaque ink to obscure components included within the housing 202. The rear cover 208 may be formed using the same material(s) that are used to form the sidewall 218 or the front cover 206, or may be formed using a different material or materials. In some cases, the rear cover 208 may be part of a monolithic element that also forms the sidewall 218 (or in cases where the sidewall 218 is a multi-segment sidewall, those portions of the sidewall 218 that are non-conductive). In still other embodiments, all of the exterior components of the housing 202 may be formed from a transparent material, and components within the device 200 may or may not be obscured by an opaque ink or opaque structure within the housing 202.

The front cover 206 may be mounted to the sidewall 218 to cover an opening defined by the sidewall 218 (i.e., an opening into an interior volume in which various electronic components of the device 200, including the display 204, may be positioned). The front cover 206 may be mounted to the sidewall 218 using fasteners, adhesives, seals, gaskets, or other components.

A display stack or device stack (hereafter referred to as a "stack") including the display 204 may be attached (or abutted) to an interior surface of the front cover 206 and extend into the interior volume of the device 200. In some cases, the stack may also include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 206 (e.g., to a display surface of the device 200).

The stack may also include an array of photodetectors 216, integrated with or positioned behind the display 204. The array of photodetectors 216 may extend across an area equal in size to the area of the display 204. Alternatively, the array of photodetectors 216 may extend across an area that is smaller than or greater than the area of the display 204. Although the array of photodetectors 216 is shown to have a rectangular boundary, the array could alternatively have a boundary with a different shape, including, for example, an irregular shape. The array of photodetectors 216 may be variously configured as a biometric sensor, a camera, a depth sensor, and so on. The array of photodetectors 216 may also function as a proximity sensor, for determining whether an object (e.g., a finger, face, or stylus) is proximate to the front cover 206.

In some cases, a force sensor (or part of a force sensor system) may be positioned within the interior volume below and/or to the side of the display 204 (and in some cases within the stack). The force sensor (or force sensor system) may be triggered in response to the touch sensor detecting one or more touches on the front cover 206 (or indicating a location or locations of one or more touches on the front cover 206), and may determine an amount of force associated with each touch, or an amount of force associated with the collection of touches as a whole.

As shown primarily in FIG. 2A, the device 200 may include various other components. For example, the front of the device 200 may include one or more front-facing cameras 210 (including one or more image sensors), speakers 212, microphones, or other components 214 (e.g., audio, imaging, and/or sensing components) that are configured to transmit or receive signals to/from the device 200. In some cases, a front-facing camera 210, alone or in combination with other sensors, may be configured to operate as a bio-authentication or facial recognition sensor. Additionally or alternatively, the array of photodetectors 216 may be configured to operate as a front-facing camera 210, a bio-authentication sensor, or a facial recognition sensor.

The device 200 may also include buttons or other input devices positioned along the sidewall 218 and/or on a rear surface of the device 200. For example, a volume button or multipurpose button 220 may be positioned along the sidewall 218, and in some cases may extend through an aperture in the sidewall 218. The sidewall 218 may include one or more ports 222 that allow air, but not liquids, to flow into and out of the device 200. In some embodiments, one or more sensors may be positioned in or near the port(s) 222. For example, an ambient pressure sensor, ambient temperature sensor, internal/external differential pressure sensor, gas sensor, particulate matter concentration sensor, or air quality sensor may be positioned in or near a port 222.

In some embodiments, the rear surface of the device 200 may include a rear-facing camera 224 (including one or more image sensors; see FIG. 1B). A flash or light source 226 may also be positioned along the rear of the device 200 (e.g., near the rear-facing camera). In some cases, the rear surface of the device 200 may include multiple rear-facing cameras.

Figure 3:
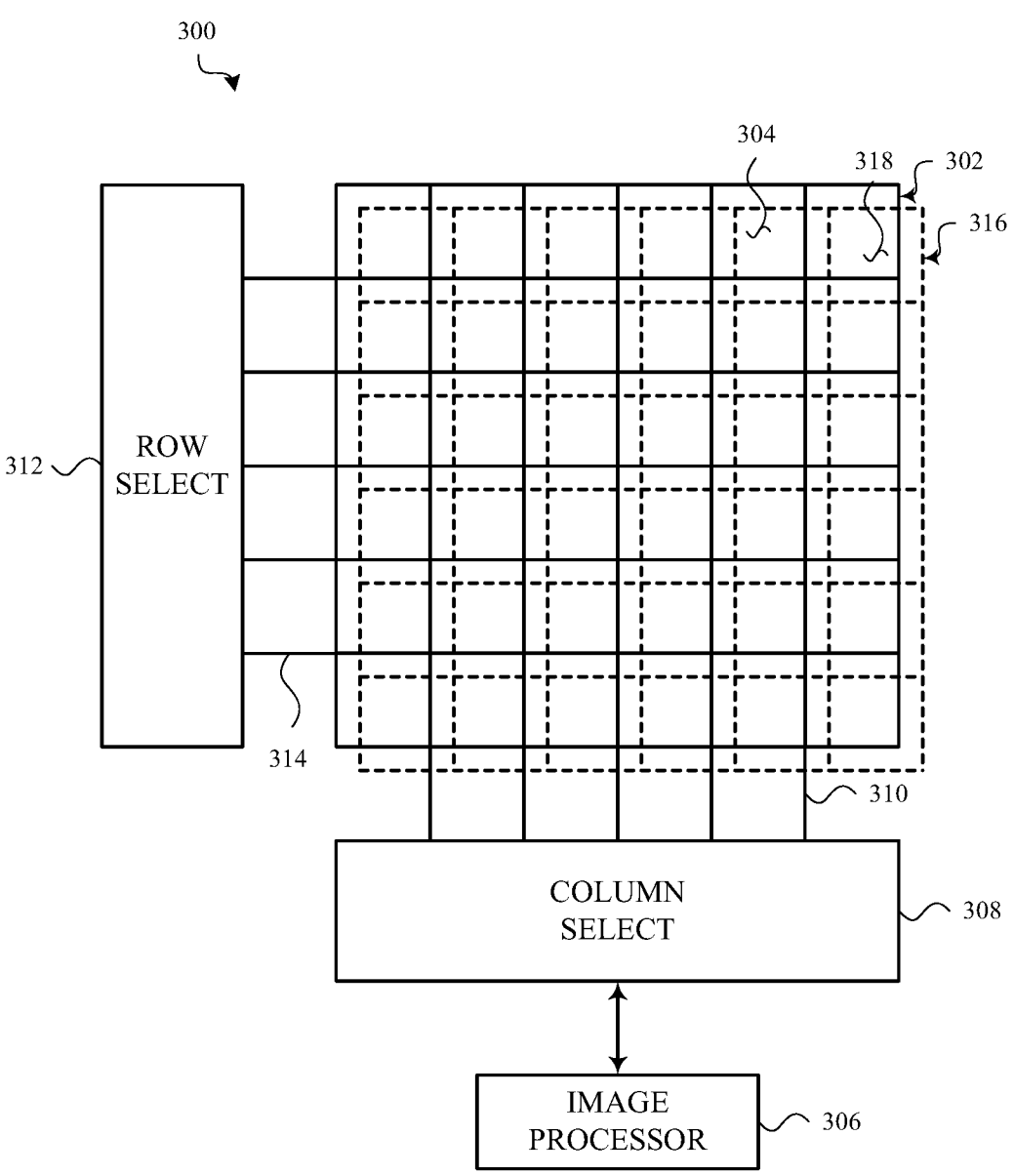
FIG. 3 shows an example plan view of arrays of light-emitting elements and photodetectors that may be included in a stack positioned under the cover of the device described with reference to FIGS. 1A-1B and 2A-2B.

FIG. 3 shows an example plan view of arrays 300 of light-emitting elements and photodetectors that may be included in a stack positioned under the cover of the device described with reference to FIGS. 1A-1B or 2A-2B.

A first array 302 may include a set of photodetectors 304. The set of photodetectors 304 may be coupled to an image processor 306. The photodetectors 304 may detect the same wavelength of electromagnetic radiation or different wavelengths of electromagnetic radiation. In the illustrated embodiment, the photodetectors 304 are arranged in rows and columns. However, the photodetectors 304 may alternatively be arranged in any suitable configuration, such as, for example, a hexagonal configuration.

The first array 302 may be in communication with a column select circuit 308 through one or more column select lines 310, and with a row select circuit 312 through one or more row select lines 314. The row select circuit 312 may selectively activate a particular photodetector 304 or group of photodetectors, such as all of the photodetectors 304 in a row. The column select circuit 308 may selectively receive the data output from a selected photodetector 304 or group of photodetectors 304 (e.g., all of the photodetectors 304 in a row).

The row select circuit 312 and/or column select circuit 308 may be in communication with the image processor 306. The image processor 306 may process data received from the photodetectors 304 and provide that data to another processor (e.g., a system processor) and/or other components of a device (e.g., other components of the device described with reference to FIGS. 1A-1B or 2A-2B).

In some embodiments, the first array 302 may be configured as a rolling shutter image sensor, in which different rows or columns of photodetectors 304 are sequentially enabled and read out. In other embodiments, the first array 302 may be configured as a global shutter image sensor, in which all of the photodetectors 304 are enabled at once, charges integrated by the photodetectors 304 are locally stored, and then the charges are read out by row or column.

A second array 316 may include a set of light-emitting elements 318 defining a display. The first and second arrays 302, 316 may be stacked, such that the first array 302 is positioned behind the second array 316 when an image projected by the display is viewed by a user. Alternatively, the first and second arrays 302, 316 may be integrated and share a common backplane. In these latter embodiments, the photodetectors 304 may be positioned behind or alongside the light-emitting elements 318 of the display.

FIGS. 4A-4C show a first example configuration of the stack 400 (a device stack, or display stack) described with reference to FIGS. 1A-1B, 2A-2B, and 3. The stack 400 may include a display 402 (including a backplane, such as a first TFT backplane, with supporting circuitry), an optional array of optical elements 404 (or optical element, such as one or more lenses (e.g., micro-lenses), collimators, optical waveguides, optical polarizers, or optical films) positioned behind the display 402, an array of photodetectors 406 (or at least one photodetector, including a second TFT backplane with supporting circuitry) positioned behind the display 402 or optional array of optical elements 404, and a processor 408 (e.g., a silicon-based integrated circuit (IC), such as a System-on-Chip (SOC)) positioned behind the array of photodetectors 406. In some embodiments, the display 402 may be a top-emission OLED display or a bottom-emission LCD display. In some embodiments, the optional array of optical elements 404 may be attached to the display; the array of photodetectors 406 may be attached to the optional array of optical elements 404 or the display 402; and the processor 408 may be attached to the array of photodetectors (or at least electrically connected to the display 402 and array of photodetectors 406). The various components 402, 404, 406, 408 may be attached using an adhesive, different types of adhesive, or one or more types of fasteners (e.g., screws or clamps).

As shown in FIG. 4A, the display 402 may emit electromagnetic radiation 410 (e.g., electromagnetic radiation, such as visible light, that defines an image; electromagnetic radiation having one or more predetermined wavelengths and emitted primarily or solely for sensing purposes; or a combination of electromagnetic radiation that defines an image and electromagnetic radiation having one or more predetermined wavelengths and emitted primarily or solely for sensing purposes).

When an object 412 (e.g., a finger, face, or stylus) is placed within the emission field of the emitted electromagnetic radiation 410, some of the electromagnetic radiation 410 may reflect or backscatter off the object 412 and impinge on the display 402. Some of the reflected or backscattered electromagnetic radiation 414 may pass through the display 402, as shown in FIG. 4B. For example, there may be windows in the display 402, through which electromagnetic radiation, or at least electromagnetic radiation of particular wavelengths, may pass. In some cases, the windows may be defined between overlapping conductive traces, components, and/or other opaque elements of the display 402. In some cases, reflected or backscattered electromagnetic radiation 414 may also pass through conductive traces, components, and/or other elements of the display 402 that are transparent to one or more wavelengths of electromagnetic radiation.

After passing through the display 402, and when the optional array of optical elements 404 is provided, the reflected or backscattered electromagnetic radiation 414 may pass through the array of optical elements 404, as also shown in FIG. 4B. Typically, only a small fraction of the electromagnetic radiation 410 that is emitted by the display 402 may be reflected or backscattered and pass through the display 402 (e.g., less than 10%, less than 5%, or even less than 1% of the emitted electromagnetic radiation). However, a majority of the electromagnetic radiation that passes through the display 402 (e.g., 80%, 90%, or 99% of the electromagnetic radiation) may pass through the array of optical elements 404. The array of optical elements 404 may collimate electromagnetic radiation, or focus or direct electromagnetic radiation toward the photodetectors in the array of photodetectors 406.

The reflected or backscattered electromagnetic radiation 414 may be received by the array of photodetectors 406, and each photodetector in the array may generate an electrical signal 416 indicative of a received amount of electromagnetic radiation. The photodetectors in the array may each be configured to sense the same wavelength(s) of electromagnetic radiation, or different photodetectors may be filtered or otherwise configured to sense different wavelengths of electromagnetic radiation. The signal(s) 416 generated by the photodetectors may be received by the processor 408, as shown in FIG. 4C. The signals 416 of different photodetectors may be received by the processor 408 individually, or may be combined in various ways and provided to the processor 408. In some cases, the processor 408 may generate an image (2D image) of the object 412, a depth map (3D image), or a video clip (e.g., a sequence of 2D or 3D images) , using one or more signals 416 received from the array of photodetectors 406. Additionally or alternatively, the processor 408 may determine a proximity of the object 412, using one or more signals 416 received from the array of photodetectors 406. The processor 408 may also or alternatively use one or more signals 416 received from the array of photodetectors 406 to extract biometric information for the object 412.

Figure 5:
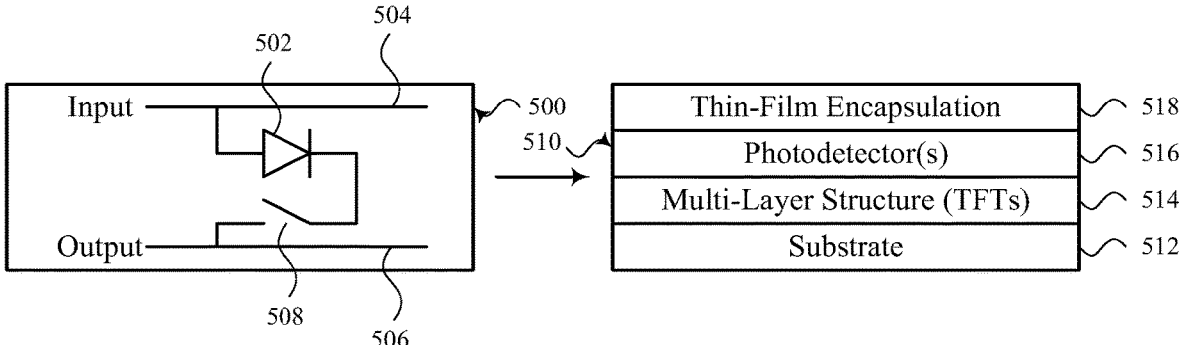
FIG. 5 shows an example schematic and layer structure for an array of photodetectors (or photodetector), such as the array of photodetectors described with reference to FIGS. 4A-4C.

FIG. 5 shows an example schematic 500 and layer structure 510 for an array of photodetectors (or photodetector), such as the array of photodetectors described with reference to FIGS. 4A-4C. By way of example, the schematic 500 only shows one photodetector 502 and supporting circuitry (e.g., readout circuitry). An array of photodetectors may include many such photodetectors 502, each having its own supporting circuitry, or with sets of photodetectors having shared supporting circuitry.

The photodetector 502 (e.g., a photodiode) may be electrically connected to a first conductor (e.g., an input electrode 504) and a second conductor (e.g., an output signal line 506). The photodetector 502 may be electrically connected to the second electrode by a switch 508 that provides, or is included in, a readout circuit for the photodetector 502.

The layer structure 510 may include a substrate 512 (e.g., a flexible substrate), a multi-layer structure 514 deposited on the substrate 512, an array of photodetectors 516 (or at least one photodetector) attached to the multi-layer structure 514 and including an organic photosensitive material, and an optional thin-film encapsulation material 518 deposited over the organic photosensitive material of the array of photodetectors 516. In some embodiments, each photodetector in the array of photodetectors 516 may be O-APD. The multi-layer structure 514 may include a set of TFTs. The organic photosensitive material of the photodetectors in the array of photodetectors 516 may be electrically connected to at least one readout transistor in the set of TFTs.

FIGS. 6A-6D show various example configurations of the stack described with reference to FIGS. 1A-1B, 2A-2B, 3, 4A-4C, and 5. Each of the configurations shows a sensor module 600, 666, 672, or 676 (e.g., a sensor stack, or stack) that may be attached to the backside of a display 602. In some cases, the sensor module 600 may be attached to the display 602 using an adhesive, such as an optically clear adhesive (OCA) 604. In some cases, the sensor module 600 may be attached to the display 602 via one or more optical elements or arrays of optical elements (i.e., one or more optical elements positioned between the display 602 and the sensor module 600), such as one or more lenses (e.g., micro-lenses), collimators, optical waveguides, optical polarizers, or optical films.

Figure 6A:
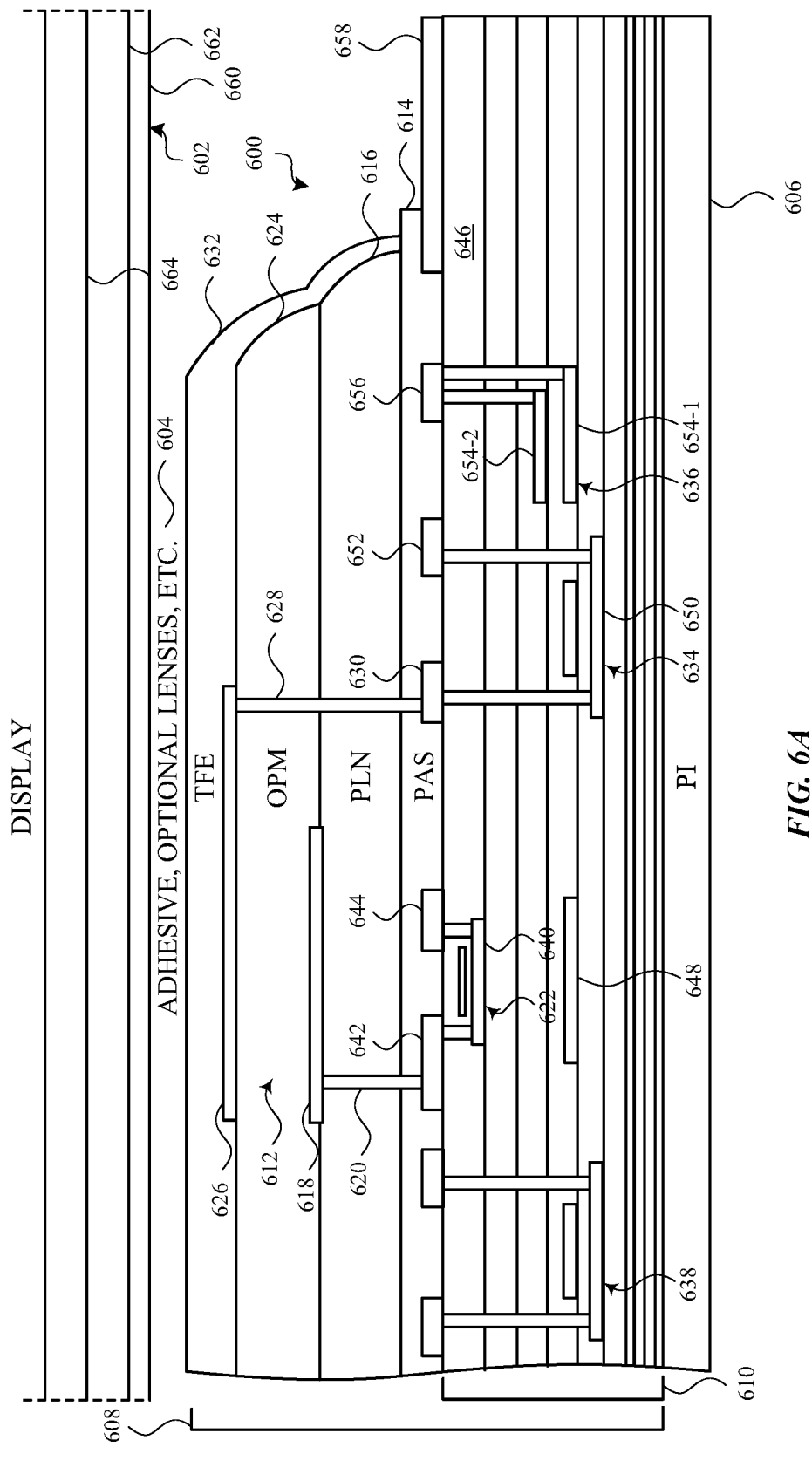
FIGS. 6A-6D show various example configurations of the stack described with reference to FIGS. 1A-1B, 3, 4A-4C, and 5.
Figure 6B:
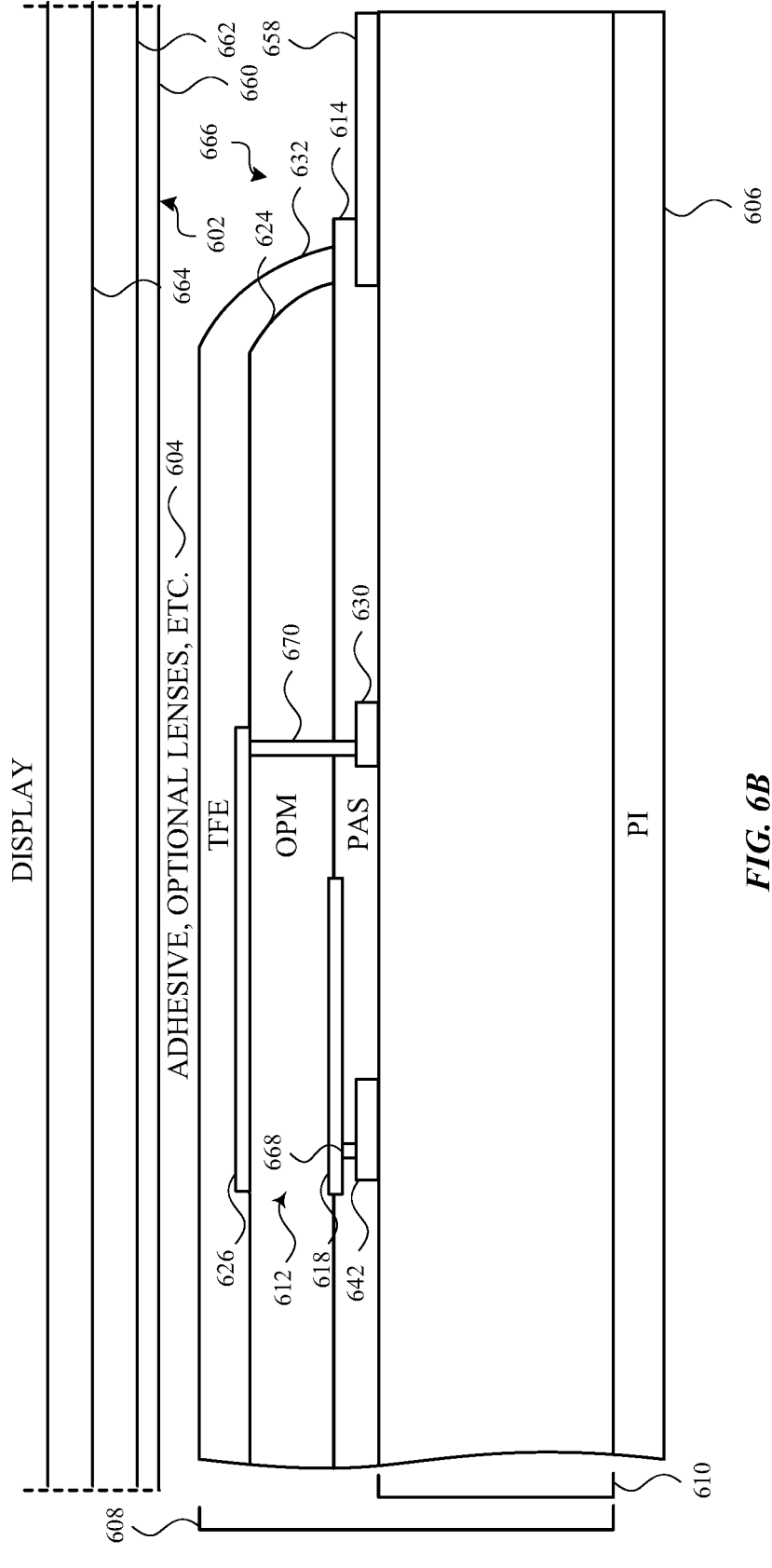
Figure 6C:
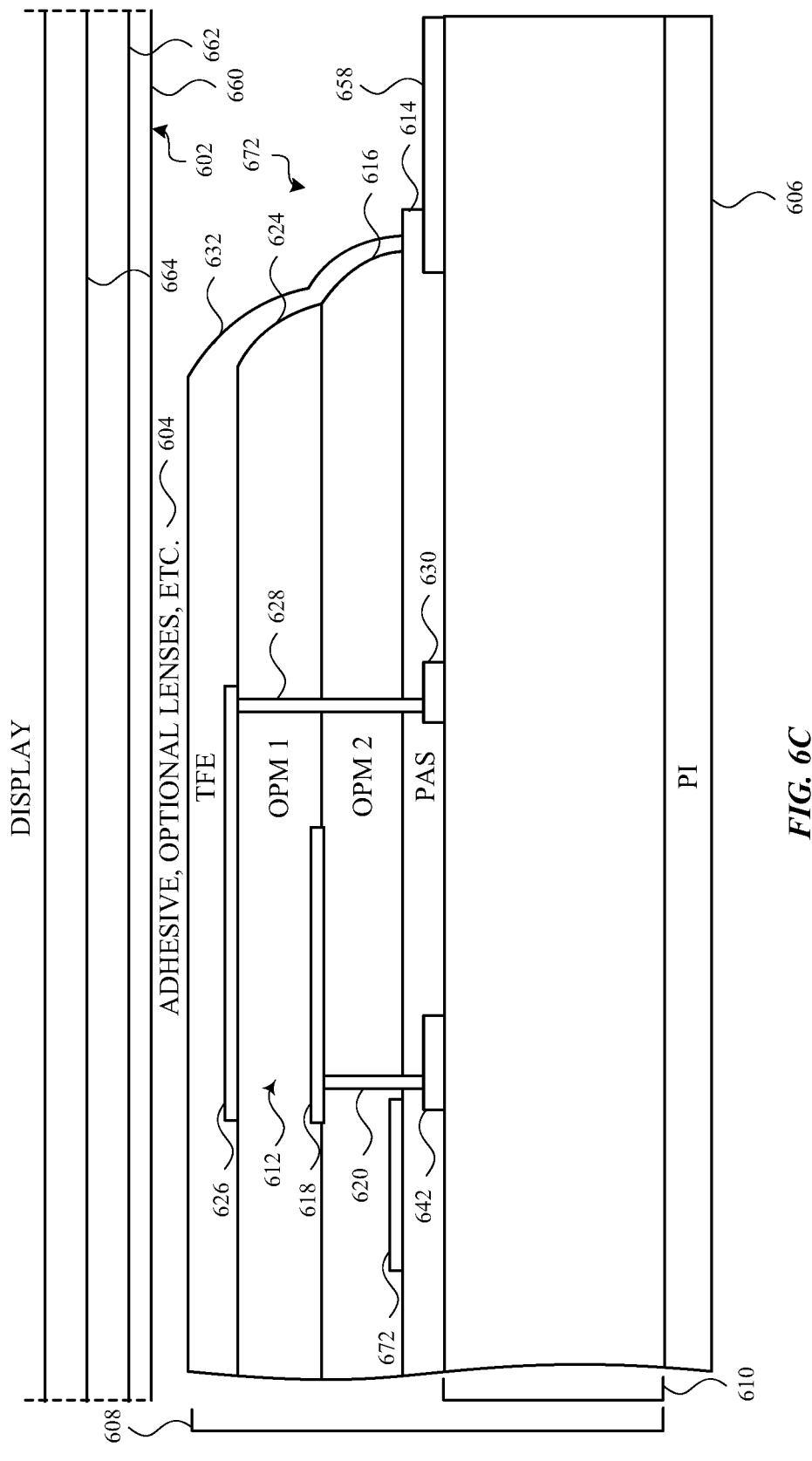
Figure 6D:
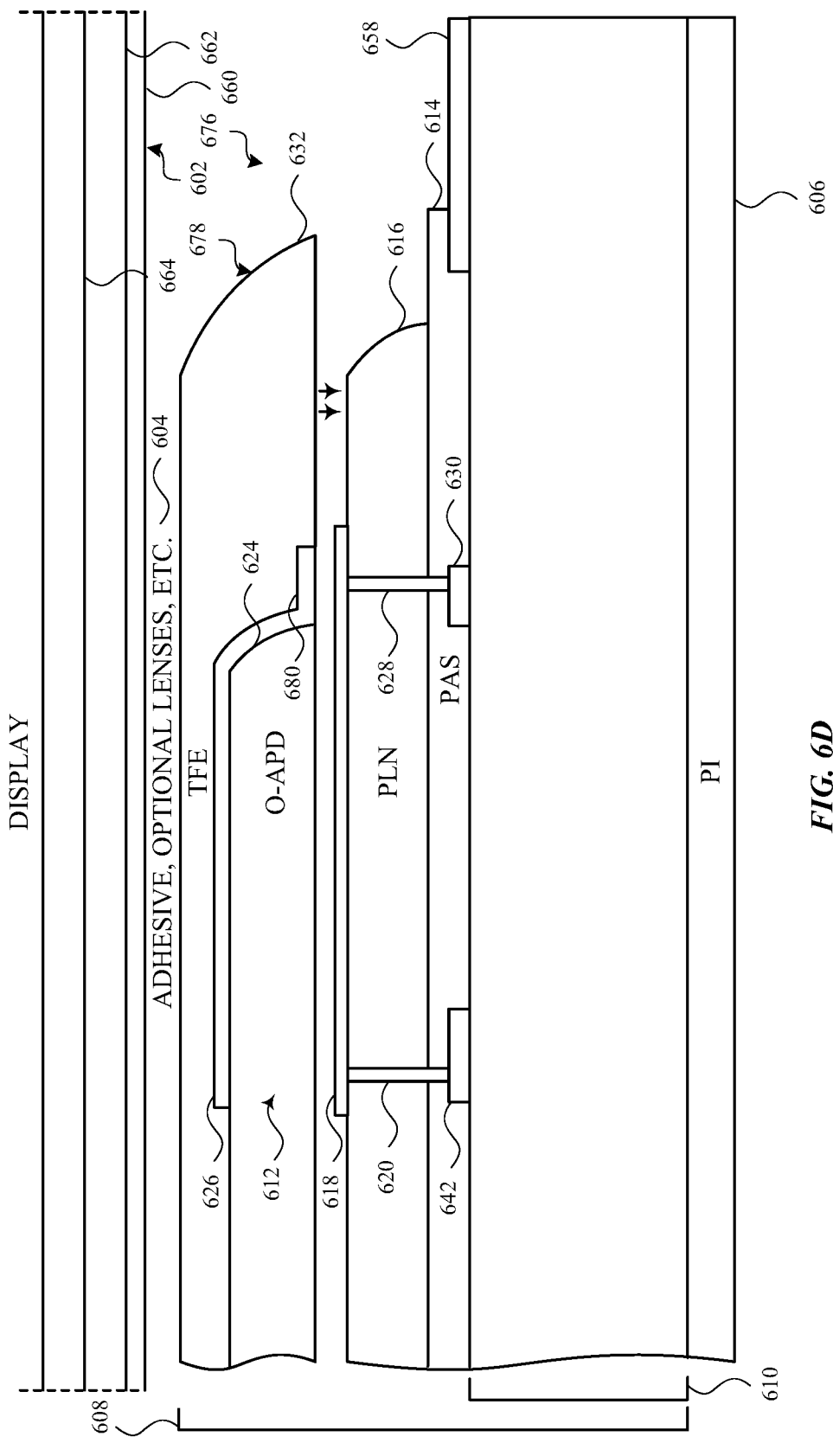

Each sensor module 600 may include a substrate 606. The substrate 606 may be a flexible substrate, and in some cases may be a polyimide (PI) substrate. A multi-layer structure 608 including a plurality of thin-films (e.g., thin-film dielectrics, thin-film conductors (e.g., metal films), thin-film organic materials, and thin-film circuit components such as thin-film transistors (TFTs), capacitors, and so on) may be deposited on the substrate 606. Examples of the layers and circuit components that may be included in a first set of layers 610 of the multi-layer structure 608 are shown in FIG. 6A. FIGS. 6B-6D only refer to the first set of layers 610 generally, but it is noted that the example layers and circuit components shown in FIG. 6A may be incorporated into any of the multi-layer structures shown in FIGS. 6B-6D.

Turning to FIG. 6A, the first set of layers 610 may include a set of TFTs for supporting a photodetector 612 or an array of photodetectors including the photodetector 612. In some examples, the photodetector 612 may be an O-APD. The photodetector 612 may be separated from conductors and circuit components in the first set of layers 610 by one or more vias 620, 628, but may otherwise be electrically insulated from the conductors and circuit components in the first set of layers 610 by a number of non-conductive layers. For example, a passivation (PAS) layer 614 may be deposited on the first set of layers 610, and a first planarization (PLN) layer 616 may be deposited on the PAS layer 614. A metal layer defining a first electrode (e.g., an anode 618) of the photodetector 612 may be deposited on the first PLN layer 616. The anode 618 may be electrically connected to a via 620 (or set of vias) formed through the first PLN layer 616 and PAS layer 614. The via 620 may electrically connect the photodetector 612 to a TFT in the first set of layers 610, such as a drive TFT 622 (or bias TFT). An organic photosensitive material (OPM) 624 of the photodetector 612 may be deposited on the first PLN layer 616 and anode 618 to form a second PLN layer. A metal layer defining a second electrode (e.g., a cathode 626) of the photodetector 612 may be deposited on the organic photosensitive material 624. The cathode 626 may be electrically connected to a via 628 (or set of vias) formed through the organic photosensitive material 624, first PLN layer 616, and PAS layer 614. The via 628 may electrically connect the photodetector 612 to a node, readout TFT 634, or other structure in the first set of layers 610. In some embodiments, one or both of the anode 618 and cathode 626 may include indium tin oxide (ITO) or molybdenum/TAT (Mo/TAT). In some embodiments, multiple photodetectors may be defined using the organic photosensitive material, with different photodetectors being defined using a shared quantity of the organic photosensitive material, or with different photodetectors being defined by discrete quantities of the organic photosensitive material. Thin-film encapsulation (TFE) 632 may be deposited over part or all of the cathode 626, organic photosensitive material 624, first PLN layer 616, PAS layer 614, and/or first set of layers 610.

The first set of layers 610 in the multi-layer structure 608 may include various TFTs and other components, with various parts of the TFTs and other components being defined in, or being electrically insulated from other components by, layers of thin-film dielectrics. The dielectrics may have the same or different composition. By way of example, the drive TFT 622, a TFT 634 (e.g., a readout TFT) and capacitor 636 of a gate-in-panel (GIP) circuit, and another arbitrary TFT 638 are shown in the first set of layers

610. However, any number of TFT or other components may be formed in the first set of layers 610, and may be connected to perform any number of circuit functions (e.g., to perform drive, readout, and/or storage functions).

The drive TFT 622 may function as a switch to drive a signal to, or bias, the anode 618 of the photodetector 612. The drive TFT 622 may include a gate 640 that is coupled (by first and second vias) between a first electrical contact 642 and a second electrical contact 644. The first and second electrical contacts 642, 644 may be formed on the first set of layers 610 and be covered by (or be in) the PAS layer 614. The gate 640 may be formed on, or be surrounded by (or be in) any TFT dielectric layer, but in some cases may be formed in a TFT oxide layer 646 (e.g., an oxide interlayer dielectric (Oxide ILD) layer) disposed below the PAS layer 614, making the drive TFT 622 an Oxide TFT. In some cases, the gate 640 of the drive TFT 622 may be formed using indium gallium zinc oxide (IGZO) and/or the drive TFT 622 may be an LTPO Oxide TFT. The via 620 may be electrically connected to the anode 618 and the electrical contact 642, and may electrically connect the anode 618 to the drive TFT 622 via the electrical contact 642. In some cases, an electromagnetic shield 648 (e.g., a metal shield) may be disposed between the gate 640 and the substrate 606.

The gate 650 of the readout TFT 634 may in some cases be formed of silicon (or polysilicon), and may be connected (by first and second vias) between a first electrical contact 630 and a second electrical contact 652. In some cases, the readout TFT 634 may be constructed as a Low-Temperature Polysilicon (LTPS) device within an LTPO backplane. The first and second electrical contacts 630, 652 may be formed on the first set of layers 610 and be covered by (or be in) the PAS layer 614. In some cases, all electrical contacts of all components in the first set of layers 610 may be formed in a common electrical contact layer. The capacitor 636 may have first and second plates 654-1, 654-2 coupled to one or more electrical contacts 656.

The TFT 638 may be constructed similarly to the TFT 634. The TFTs 634, 638 may be LTPS TFT devices, whereas the TFT 622 may be an Oxide TFT device. In some cases, driving (or bias) TFTs may be formed as Oxide TFTs, and switching TFTs (e.g., readout TFTs) may be formed as LTPS TFTs. One or more of the TFTs 622, 634, 638, the capacitor 636, or other components may be electrically connected to a conductive pad 658 or other electrical contact positioned on the first set of layers 610 (or elsewhere) around the periphery (or elsewhere) of the sensor module 600.

In some examples, the display 602 may be an OLED display or a bottom-emission liquid crystal display (LCD). In some examples, the display 602 may include a second substrate 660 (e.g., a flexible substrate, such as a PI substrate), and a second multi-layer structure 662 deposited on the second substrate 660. The second multi-layer structure 662 may include a second set of TFTs for supporting the display 602. An organic light-emitting material 664 may be deposited on the second multi-layer structure 662, and may be electrically connected to a set of drive transistors in the second set of TFTs.

In some examples, the first set of layers 610, or the multi-layer structure 608 as a whole, may be constructed by depositing a set of thin films on the substrate 606. In some examples, the first set of layers 610, or the multi-layer structure 608 as a whole, may be constructed as an LTPO backplane, similar to an LTPO organic light-emitting diode (OLED) display backplane. The display 602 may include a separate, but similarly constructed, LTPO OLED display backplane (e.g., a backplane including the second substrate 660 and second multi-layer structure 662). An LTPO backplane may provide an advantage of lower power consumption than backplanes constructed using other processes. Constructing both the OLED display backplane and the sensor module backplane as LTPO backplanes can provide manufacturing savings (e.g., by using the same manufacturing process for both backplanes).

FIG. 6B shows an alternative configuration for the sensor module described with reference to FIG. 6A. The sensor module 666 shown in FIG. 6B differs from the sensor module described with reference to FIG. 6A in that it does not include the first PLN layer 616 shown in FIG. 6A. Instead, a metal layer defining a first electrode (e.g., an anode 618) of the photodetector 612 may be deposited on the PAS layer 614, and the anode 618 may be electrically connected to a via 668 formed through the PAS layer 614. The via 668 may electrically connect the photodetector 612 to a drive TFT (or bias TFT) via an electrical contact 642. The organic photosensitive material 624 of the photodetector 612 may be deposited on the PAS layer 614 and anode 618 to form a PLN layer. A metal layer defining a second electrode (e.g., a cathode 626) of the photodetector 612 may be deposited on the organic photosensitive material 624. The cathode 626 may be electrically connected to a via 670 (or set of vias) formed through the organic photosensitive material 624 and PAS layer 614. The via 670 may electrically connect the photodetector 612 to a node 630, readout transistor, or other structure in the first set of layers 610. In some embodiments, multiple photodetectors may be defined using the organic photosensitive material, with different photodetectors being defined using a shared quantity of the organic photosensitive material, or with different photodetectors being defined by discrete quantities of the organic photosensitive material. TFE may be deposited over part or all of the cathode 626, organic photosensitive material 624, PAS layer 614, and/or first set of layers 610.

FIG. 6C shows another alternative configuration for the sensor module described with reference to FIG. 6A. The sensor module 672 shown in FIG. 6C differs from the sensor module described with reference to FIG. 6A in that the first PLN layer 616 shown in FIG. 6A is part of the photodetector 612. For example, the first PLN layer 616 may include an organic photosensitive material, and in some cases may be deposited as another layer of the organic photosensitive material 624. Two layers of the organic photosensitive material 624, distinguished in FIG. 6C as a lower layer labeled OPM 1, and an upper layer labeled OPM 2, can enhance the strength of the signal generated by the photodetector 612, and can enable tuning of the two layers to provide a micro-cavity effect (which may also enhance the signal generated by the photodetector 612. Two layers of the organic photosensitive material 624 can also create room for extra metal routing, as indicated by the presence of the metal 674. In some embodiments, multiple photodetectors may be defined using the layers of organic photosensitive material, with different photodetectors being defined using a shared quantity of organic photosensitive material, or with different photodetectors being defined by discrete quantities of the organic photosensitive material.

FIG. 6D shows another alternative configuration for the sensor module described with reference to FIG. 6A. The sensor module 676 shown in FIG. 6D primarily differs from the sensor module described with reference to FIG. 6A in terms of its manner of construction. For example, instead of the organic photosensitive material 624 being deposited on the PLN layer 616 to form a second PLN layer, the organic photosensitive material 624 may be deposited to form a separate structure 678. A metal layer defining a second electrode (e.g., a cathode 626) of the photodetector 612 may be deposited on the organic photosensitive material 624. A portion of the metal may extend past an edge of the organic photosensitive material 624 to form a conductive pad 680. TFE 632 may be deposited over part or all of the cathode 626, organic photosensitive material 624, and conductive pad 680. The separate structure 678 may then be attached to the PLN layer 616 using an add-on module process, with the anode 618 contacting the organic photosensitive material 624, and the conductive pad 680 contacting a via 628 connected to the node 630, or a readout transistor, or another structure in the first set of layers 610. Deposition of the organic photosensitive material 624 to form a separate structure 678 may enable more design flexibility when creating the photodetector 612 (or an array of such photodetectors). In some embodiments, multiple photodetectors may be defined using the organic photosensitive material, with different photodetectors being defined using a shared quantity of the organic photosensitive material, or with different photodetectors being defined by discrete quantities of the organic photosensitive material.

FIG. 7 shows a second example configuration of the stack (a device stack, or display stack) described with reference to FIGS. 1A-1B, 2A-2B, and 3. The stack 700 may include a display 702 with an array of embedded photodetectors (or at least one photodetector), and a processor 704 (e.g., a silicon-based IC, such as an SOC) positioned behind the display 702. In some examples, the display 702 may be an OLED display or a bottom-emission LCD. The display 702 may include a backplane (e.g., a TFT backplane) with circuitry for supporting both the display 702 and the array of embedded photodetectors. Optionally, an array of optical elements (or optical element, such as one or more lenses (e.g., micro-lenses), collimators, optical waveguides, optical polarizers, or optical films) may be positioned over or within the display 702, but the array of optical elements described with reference to FIGS. 4A-4C is not needed as a result of the array of photodetectors being embedded within the display 702 (instead of behind the display 702). The processor 704 may be attached to the display 702, or at least electrically connected to the display 702 and its array of embedded photodetectors. In some examples, the stack 700 may be included in the device 200 described with reference to FIGS. 2A-2B.

As shown in FIG. 7, the display 702 may emit electromagnetic radiation 706 (e.g., electromagnetic radiation, such as visible light, that defines an image; electromagnetic radiation having one or more predetermined wavelengths and emitted primarily or solely for sensing purposes; or a combination of electromagnetic radiation that defines an image and electromagnetic radiation having one or more predetermined wavelengths and emitted primarily or solely for sensing purposes).

When an object 708 (e.g., a finger, face, or stylus) is placed within the emission field of the emitted electromagnetic radiation 706, some of the electromagnetic radiation 706 may reflect or backscatter off the object 708 and impinge on the display 702. Some of the reflected or backscattered electromagnetic radiation 710 may pass into the display 702. In some cases, reflected or backscattered electromagnetic radiation 710 may also pass through conductive traces, components, and/or other elements of the display 702 that are transparent to one or more wavelengths of electromagnetic radiation.

Typically, a small fraction of the electromagnetic radiation 706 that is emitted by the display 702 may be reflected or backscattered and pass into the display 702, but the fraction may be considerably more than would pass through the display described with reference to FIGS. 4A-4C. After passing into the display 702, the reflected or backscattered electromagnetic radiation 710 may be received by the array of photodetectors, and each photodetector in the array may generate a signal 712 indicative of a received amount of electromagnetic radiation. The photodetectors in the array may each be configured to sense the same wavelength(s) of electromagnetic radiation, or different photodetectors may be filtered or otherwise configured to sense different wavelengths of electromagnetic radiation. The signal(s) 712 generated by the photodetectors may be received by the processor 704. The signals of different photodetectors may be received by the processor 704 individually, or may be combined in various ways and provided to the processor 704. In some cases, the processor 704 may generate an image (2D image) of the object 708 or a depth map (3D image), or determine a proximity of the object 708, using one or more signals 712 received from the array of photodetectors. The processor 704 may also or alternatively use one or more signals 712 received from the array of photodetectors to extract biometric information for the object 708.

FIG. 8 shows an example layer structure 800 for a display with an array of embedded photodetectors (or photodetector), such as the display described with reference to FIG. 7. The layer structure 800 may include a substrate 802 (e.g., a flexible substrate), a multi-layer structure 804 deposited on the substrate 802, layers of organic photosensitive material 806 and organic light-emitting material 808 deposited on the multi-layer structure 804, and an optional thin-film encapsulation material 810 deposited over the layers of organic photosensitive material 806 and organic light-emitting material 808. The organic photosensitive material 806 may be electrically connected to a first set of TFTs in the multi-layer structure 804 to define one or more photodetectors, and the organic light-emitting material 808 may be electrically connected to a second set of TFTs in the multi-layer structure 804 to define one or more pixels of a display. The first and second sets of TFTs may be disjoint sets or partially overlapping sets. In some embodiments, the photodetectors may be O-APDs.

Figure 9A:
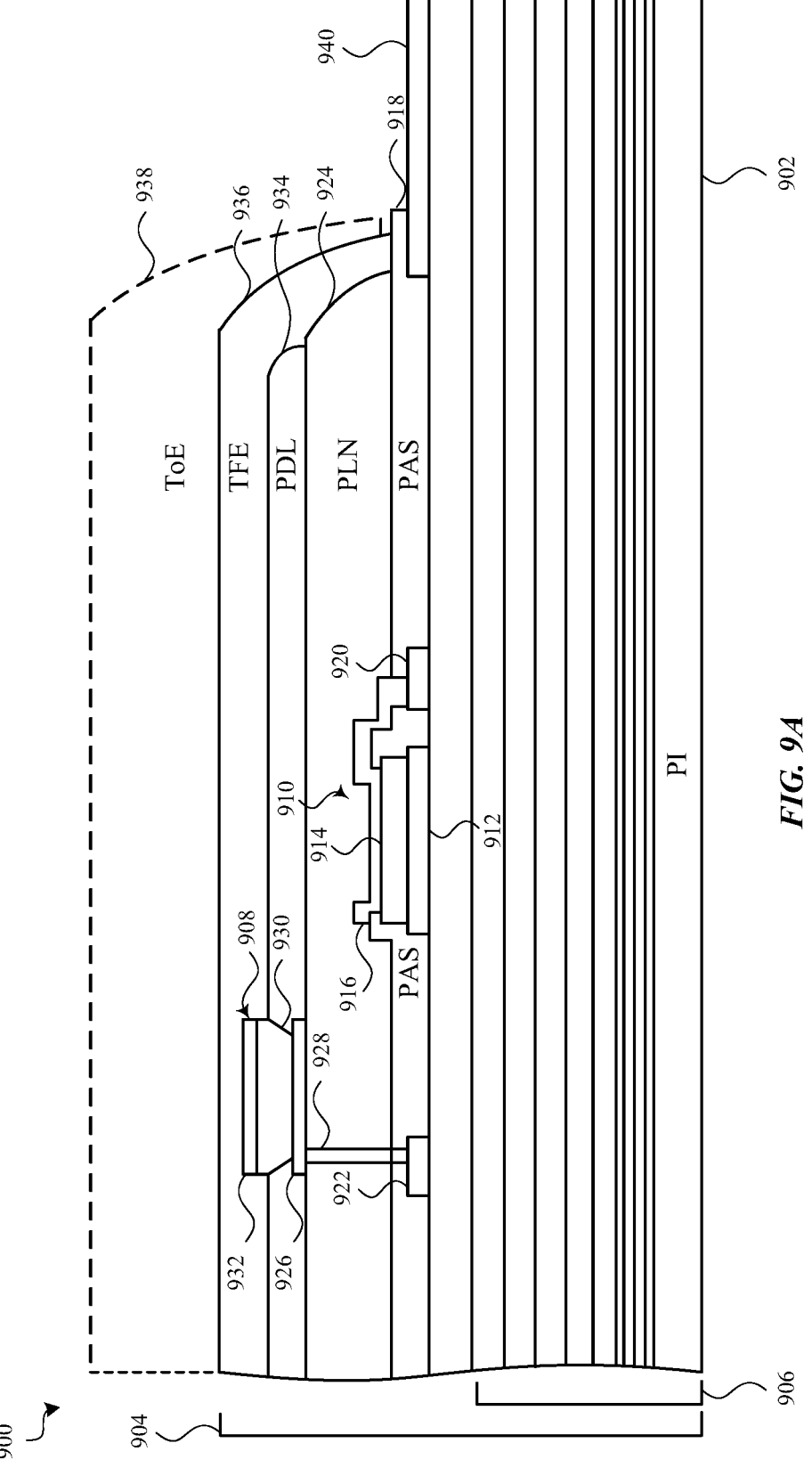
FIGS. 9A and 9B show various example configurations of the stack described with reference to FIGS. 1A-1B, 3, 7, and 8.
Figure 9B:
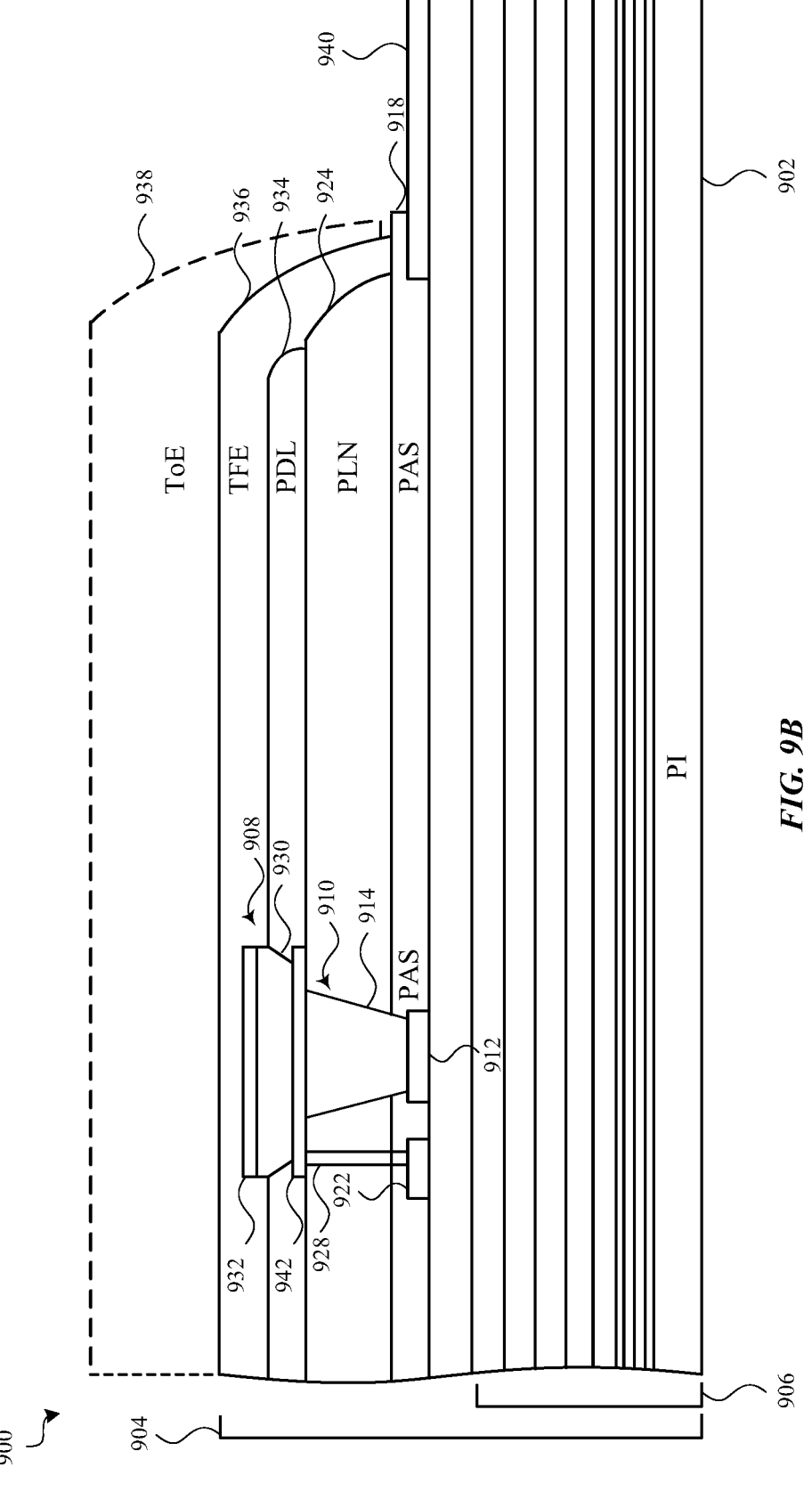

FIGS. 9A and 9B show various example configurations of the stack described with reference to FIGS. 1A-1B, 2A-2B, 3, 7, and 8. Each of the configurations shows a photodetector embedded in a display 900. Each display 900 may include a substrate 902. The substrate 902 may be a flexible substrate, and in some cases may be a PI substrate. A multi-layer structure 904 including a plurality of thin-films (e.g., thin-film dielectrics, thin-film conductors (e.g., metal films), thin-film organic materials, and thin-film circuit components such as TFTs, capacitors, and so on) may be deposited on the substrate 902. Examples of the layers and circuit components that may be included in a first set of layers 906 of the multi-layer structure 904 are shown in FIG. 6A. FIGS. 9A-9B only refer to the first set of layers 906 generally.

Turning to FIG. 9A, the first set of layers 906 may include a first set of TFTs for supporting an array of light-emitting elements 908 of the display 900, and a second set of TFTs for supporting a photodetector 910 (or an array of photodetectors including the photodetector 910). In some examples, the photodetector 910 may be an O-APD.

The photodetector 910 may be formed by depositing layers of material on the first set of layers 906. The layers may define a first electrode (e.g., an anode 912) stacked on the first set of layers 906, an organic photosensitive material 914 stacked on the anode 912, and a second electrode (e.g., a cathode 916) stacked on the organic photosensitive material 914. A PAS layer 918 may be deposited on the first set of layers 906, and may extend around the sides of the photodetector 910. The cathode 916 may extend through the PAS layer 918 and electrically connect the photodetector 910 to a node 920 (e.g., an electrical contact), readout TFT, or other structure in the first set of layers 906. The anode 912 may electrically connect the photodetector 910 to a drive TFT (or bias TFT) in the first set of layers 906.

A PLN layer 924 may be deposited on the PAS layer 918 and cathode 916. A metal layer defining a first electrode (e.g., an anode 926) of the light-emitting element 908 may be deposited on the PLN layer 924. The anode 926 may be electrically connected to a via 928 (or set of vias) formed through the PLN layer 924 and PAS layer 918. The via 928 may electrically connect the light-emitting element 908 to an electrical contact 922 of a drive TFT in the first set of layers 906. An organic light-emitting material 930 of the light-emitting element 908 may be deposited on the anode 926. A metal layer defining a second electrode (e.g., a cathode 932) of the light-emitting element 908 may be deposited on the organic light-emitting material 930. In some embodiments, one or both of the anode 926 and cathode 932 may include ITO or Mo/TAT. A pixel define layer (PDL) 934 may be deposited on the PLN layer 924, and may extend around the light-emitting element 908. In some embodiments, the PDL 934 may be deposited before one or more of the layers of the light-emitting element 908, and the PDL 934 may be patterned to make room for the layers of the light-emitting element 908.

In some embodiments, multiple photodetectors may be defined using the organic photosensitive material, with different photodetectors being defined by discrete quantities of the organic photosensitive material. Similarly, multiple light-emitting elements may be defined using the organic light-emitting material, with different light-emitting elements being defined by discrete quantities of the organic light-emitting material.

TFE 936 may be deposited over part or all of the light-emitting element 908, PDL 934, PLN layer 924, PAS layer 918, and/or first set of layers 906. In some cases, Touch on Encapsulation (ToE) components 938 may be deposited or attached to the upper surface of the TFE 936.

In some embodiments, one or more of the TFTs or other components in the first set of layers 906 may be electrically connected to a conductive pad 940 or other electrical contact positioned on the first set of layers 906 (or elsewhere) around the periphery (or elsewhere) of the display 900.

In some examples, the set of layers 906, or the multi-layer structure 904 as a whole, may be constructed by depositing a set of thin films on the substrate 902. In some examples, the first set of layers 906, or the multi-layer structure 904 as a whole, may be constructed as an LTPO OLED display backplane. An LTPO backplane may provide an advantage of lower power consumption than backplanes constructed using other processes. Integrating photodetectors and their support circuitry into the same backplane used for the display 900 can provide manufacturing savings (e.g., by using the same manufacturing process for both display and photodetector support circuitry).

FIG. 9B shows an alternative configuration for the stack described with reference to FIG. 9A. The stack shown in FIG. 9B differs from the stack described with reference to FIG. 9A in that, instead of the PLN layer 924 extending between the organic light-emitting material 930 of the photodetector 910 and the organic photosensitive material 914 of the light-emitting element 908, with the organic photosensitive material 914 and the organic light-emitting material 930 being non-overlapping, the organic photosensitive material 914 of the photodetector 910 is positioned under the organic light-emitting material 930 of the light-emitting element 908 in the stack of FIG. 9B. This can enable sharing of an electrode 942. In particular, the single electrode 942 may replace the cathode of the photodetector described with reference to FIG. 9A and the anode of the light-emitting element described with reference to FIG. 9A, with the organic photosensitive material 914 being disposed on one side of the electrode 942, and the organic light-emitting material 930 being disposed on an opposite side of the electrode 942.

Figure 10:
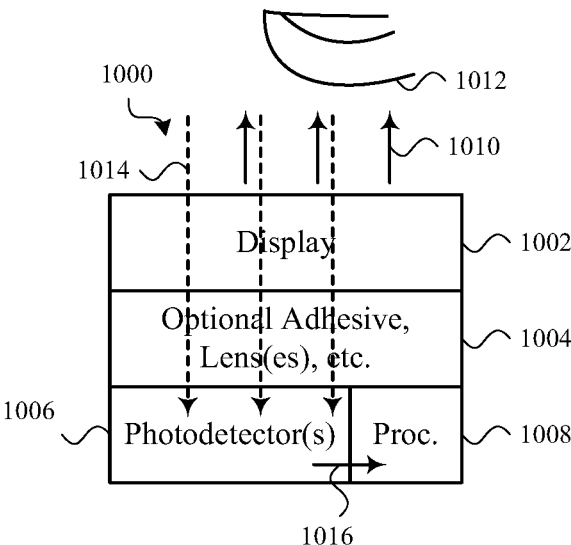
FIG. 10 shows a third example configuration of the stack (a device stack, or display stack) described with reference to FIGS. 1A-1B and 3.

FIG. 10 shows a third example configuration of the stack (a device stack, or display stack) described with reference to FIGS. 1A-1B, 2A-2B, and 3. The stack 1000 may include a display 1002 (including a backplane, such as a first TFT backplane, with supporting circuitry), an optional array of optical elements 1004 (or optical element, such as one or more lenses (e.g., micro-lenses), collimators, optical waveguides, optical polarizers, or optical films) positioned behind the display 1002, an array of photodetectors 1006 (or at least one photodetector, including a second TFT backplane with supporting circuitry) positioned behind the display 1002 or optional array of optical elements 1004, and a processor 1008 (e.g., a silicon-based IC, such as an SOC) positioned to a side of the array of photodetectors 1006 and attached to a substrate on which the second TFT backplane is fabricated. In some embodiments, the optional array of optical elements 1004 may be attached to the display, and the array of photodetectors 1006 may be attached to the optional array of optical elements 1004 or the display 1002. The various components 1002, 1004, 1006 may be attached using an adhesive, different types of adhesive, or one or more types of fasteners (e.g., screws or clamps). The processor 1008 may be electrically connected to the display 1002 and array of photodetectors 1006. In some examples, the stack 1000 may be included in the device 200 described with reference to FIGS. 2A-2B.

As shown in FIG. 10, the display 1002 may emit electromagnetic radiation 1010 (e.g., electromagnetic radiation, such as visible light, that defines an image; electromagnetic radiation having one or more predetermined wavelengths and emitted primarily or solely for sensing purposes; or a combination of electromagnetic radiation that defines an image and electromagnetic radiation having one or more predetermined wavelengths and emitted primarily or solely for sensing purposes).

When an object 1012 (e.g., a finger, face, or stylus) is placed within the emission field of the emitted electromagnetic radiation 1010, some of the electromagnetic radiation 1010 may reflect or backscatter off the object 1012 and impinge on the display 1002. Some of the reflected or backscattered electromagnetic radiation 1014 may pass through the display 1002. For example, there may be windows in the display 1002, through which electromagnetic radiation, or at least electromagnetic radiation of particular wavelengths, may pass. In some cases, the windows may be defined between overlapping conductive traces, components, and/or other opaque elements of the display 1002. In some cases, reflected or backscattered electromagnetic radiation 1014 may also pass through conductive traces, components, and/or other elements of the display 1002 that are transparent to one or more wavelengths of electromagnetic radiation.

After passing through the display 1002, and when the optional array of optical elements 1004 is provided, the reflected or backscattered electromagnetic radiation 1014 may pass through the array of optical elements 1004. Typically, only a small fraction of the electromagnetic radiation 1010 that is emitted by the display 1002 may be reflected or backscattered and pass through the display 1002 (e.g., less than 10%, less than 5%, or even less than 1% of the emitted electromagnetic radiation). However, a majority of the electromagnetic radiation that passes through the display 1002 (e.g., 80%, 90%, or 99% of the electromagnetic radiation) may pass through the array of optical elements 1004. The array of optical elements 1004 may collimate electromagnetic radiation, or focus or direct electromagnetic radiation toward the photodetectors in the array of photodetectors 1006.

The reflected or backscattered electromagnetic radiation 1014 may be received by the array of photodetectors 1006, and each photodetector in the array may generate a signal 1016 indicative of a received amount of electromagnetic radiation. The photodetectors in the array may each be configured to sense the same wavelength(s) of electromagnetic radiation, or different photodetectors may be filtered or otherwise configured to sense different wavelengths of electromagnetic radiation. The signal(s) 1016 generated by the photodetectors may be received by the processor 1008. The signals 1016 of different photodetectors may be received by the processor 1008 individually, or may be combined in various ways and provided to the processor 1008. In some cases, the processor 1008 may generate an image (2D image) of the object 1012 or a depth map (3D image), or determine a proximity of the object 1012, using one or more signals 1016 received from the array of photodetectors 1006. The processor 1008 may also or alternatively use one or more signals 1016 received from the array of photodetectors 1006 to extract biometric information for the object 1012.

FIGS. 11A-11B and 12A-12B show various example configurations of the stack described with reference to FIGS. 1A-1B, 2A-2B, 3, 4A-4C, and 10. Each of the configurations shows a sensor module 1100 (e.g., a sensor stack, or stack) that may be attached to the backside of a display 1102. In some cases, the sensor module 1100 may be attached to the display 1102 using an adhesive, such as an optically clear adhesive (OCA) 1104. In some cases, the sensor module 1100 may be attached to the display 1102 via one or more optical elements or arrays of optical elements (i.e., one or more optical elements 1104 positioned between the display 1102 and the sensor module 1100), such as one or more lenses (e.g., micro-lenses), collimators, optical waveguides, optical polarizers, or optical films. The display 1102 and elements 1104 may in some cases be configured as described with reference to FIG. 6A.

Each sensor module 1100 may include a substrate 1106. The substrate 1106 may be a flexible substrate, and in some cases may be a PI substrate. A multi-layer structure 1108 including a plurality of thin-films (e.g., thin-film dielectrics, thin-film conductors (e.g., metal films), and thin-film circuit components such as TFTs, capacitors, and so on) may be deposited on the substrate 1106.

Figure 11A:
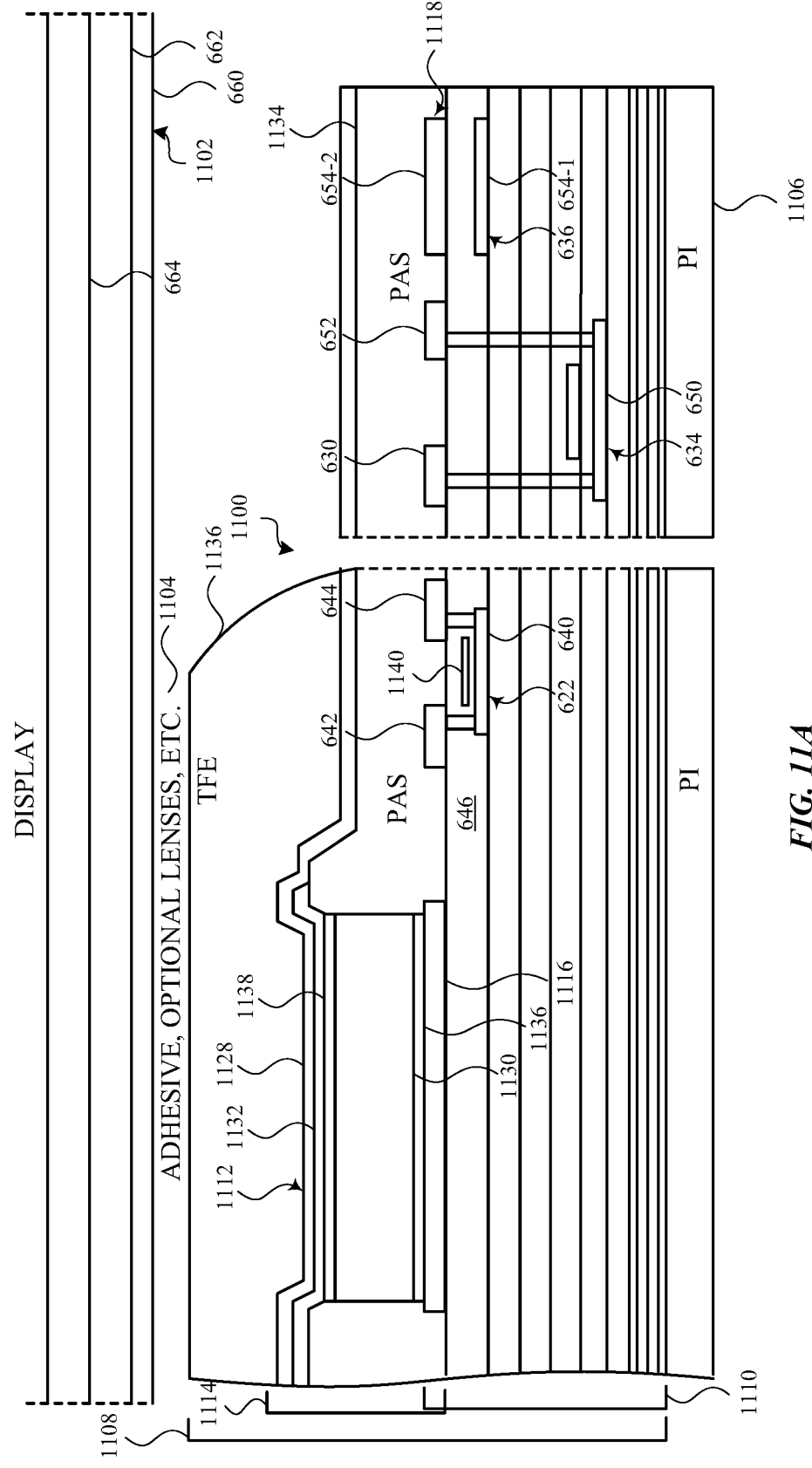
FIGS. 11A-11B and 12A-12B show various example configurations of the stack described with reference to FIGS. 1A-1B, 3, 4A-4C, and 10.

Turning to FIG. 11A, a first set of layers 1110 of the multi-layer structure 1108 may include a set of TFTs for supporting a photodetector 1112 or an array of photodetectors including the photodetector 1112. The photodetector 1112 (or array of photodetectors) may be formed in a second set of layers 1114 of the multi-layer structure 1108. The first and second sets of layers 1110, 1114 may be disjoint sets or partially overlapping sets. By way of example, FIG. 11A shows the first and second sets of layers 1110, 1114 to be partially overlapping sets of layers. For example, the photodetector 1112 included in the second set of layers 1114 may have an electrode 1116 (or electrical contact, or anode) that is formed in an electrical contact layer 1118, which electrical contact layer 1118 also includes electrical contacts 642, 644, 630, 652 or conductors 654-2 for one or more TFTs or other components (e.g., capacitor plates) included in the first set of layers 1110. The electrical contact layer 1118 is therefore shared by the first and second sets of layers 1110, 1114.

In some examples, the photodetector 1112 may be a PIN diode, constructed as a silicon-based TFT (i.e., as a silicon or polysilicon TFT). The photodetector 1112 may include a first electrode 1116 (e.g., an anode), a layer (or layers) of amorphous silicon (a-Si) 1130 deposited on the first electrode 1116, and a second electrode 1132 (e.g., a cathode) deposited on the layer(s) of amorphous silicon 1130 (e.g., a-Si:H). The first electrode 1116 may electrically connect the photodetector 1112 to a switching TFT, drive TFT, or bias TFT in the first set of layers 1110 (e.g., as described with reference to FIG. 6A), and the second electrode 1132 may electrically connect the photodetector 1112 to a high potential for reverse-biasing the photodetector 1112. A high reverse bias of a PIN diode can create a large depletion region for incoming electromagnetic radiation to generate electron-hole pairs, and increase the sensitivity of the photodetector 1112. In some embodiments, the first electrode 1130 may include one or more layers of metal, such as a stack of titanium, aluminum, and titanium layers (Ti/Al/Ti), or a Mo layer stacked on a Ti layer (Mo/Ti). In some embodiments, the second electrode 1132 may be transparent and include ITO or Mo/TAT. A PAS layer 1134 may be deposited over part or all of the second electrode 1132, around the photodetector 1112, and/or over the first set of layers 1110, or the PAS layer 1134 may be deposited first, and the photodetector 1112 may be formed by patterning the PAS layer 1134. In some cases, TFE 1128 and/or 1130 may be deposited over the sensor module 1100.

The first set of layers 1110 may include a set of TFTs 622, 634 and/or other components (e.g., a capacitor 636), as described with reference to FIG. 6A. In some cases, the TFT 634 and capacitor 636 may be part of a GIP circuit. In some cases, the TFT 622 may be an Oxide TFT and the TFT 634 may be an LTPS TFT. However, in contrast to what is shown in FIG. 6A, and in some embodiments, the photodetector 1112 and TFT 634 may have gates 1136/1130/1138, 650 formed using the same a-Si deposition process. However, the gates may have different thicknesses and/or doping. As previously mentioned, electrical contacts 1116, 642, 644, 630, 652 or electrodes 654-2 of different components, such as electrical contacts of the photodetector 1112, TFTs 622, 634, and other components (e.g., the capacitor 636), may be formed in an electrical contact layer 1118 shared by the first and second sets of layers 1110, 1114. In addition, portions of different components in the first set of layers 1110 may be formed using the same process. For example, an oxide gate metal deposition process may be used to deposit both an oxide gate metal 1140 for the Oxide TFT 622 and an electrode 654-2 (or plate) of the capacitor 636.

When the photodetector 1112 is implemented as a PIN diode and, in some cases, the amorphous silicon 1130 may have a high enough concentration of hydrogen (H) atoms (e.g., approximately ≥12.5%) that hydrogen diffusion from the amorphous silicon 1130 to the Oxide TFT 622 may cause degradation of the TFT 622. For example, hydrogen atoms that diffuse from the amorphous silicon 1130 to the TFT oxide layer 646 in which the TFT 622 is formed, during deposition of the amorphous silicon 1130 or over the lifetime of the sensor module 1100 (e.g., due to thermal driven diffusion), may combine with the oxygen vacancy in the TFT 622, making the TFT's voltage shift negatively and enhancing its speed of degradation. One way to slow or prevent the hydrogen diffusion is by patterning the shared electrical contact layer 1118 after forming the PIN diode, and/or by constructing the PAS layer 1134 as a hydrogen blocker. For example, the PAS layer 1134 may be constructed as a silicon-nitrogen (SiN$_x$). Patterning the shared electrical contact layer 1118 after forming the PIN diode enables the shared electrical contact layer 1118 to provide a temporary hydrogen blocker for the TFT 622 while the PIN diode is being formed (and before the PAS layer 1134 is deposited). In addition to (or instead of) hydrogen blocking, the materials and depth of the first electrode 1116 may be constructed to function as a hydrogen getter. For example, a first electrode 1116 having a layered Ti/Al/Ti structure, or a Mo on Ti structure, with one or more of the Ti layers of each structure having a sufficient thickness (e.g., ≥500 Angstroms (A) or ≥700 A) may function as a hydrogen getter. As another option, the oxide gate metal 1140 of the Oxide TFT 622 may be constructed as a hydrogen getter. For example, the oxide gate metal 1140 may have layers of Mo and Ti, with the Ti layer thickness having a sufficient thickness to function as a hydrogen getter (e.g., ≥500 Angstroms (A) or ≥700 A). Any of the hydrogen blockers or hydrogen getters described in this paragraph may be used separately or in conjunction.

In some examples, the display 1102 may be an OLED display or a bottom-emission LCD. By way of example, the display 1102 may be configured as described with reference to FIG. 6A.

In some examples, the first set of layers 1110, or the multi-layer structure 1108 as a whole, may be constructed by depositing a set of thin films on the substrate 1106. In some examples, the first set of layers 1110, or the multi-layer structure 1108 as a whole, may be constructed as an LTPO backplane, similar to an LTPO OLED display backplane. The display 1102 may include a separate, but similarly constructed, LTPO OLED display backplane.

In some embodiments, the GIP circuit or other circuitry may be positioned to one side (or sides) of the substrate 1106, and the substrate 1106 and multi-layer structure 1108 may be folded to position the GIP circuit or other circuitry in a different plane than the photodetector 1112.

Figure 11B:
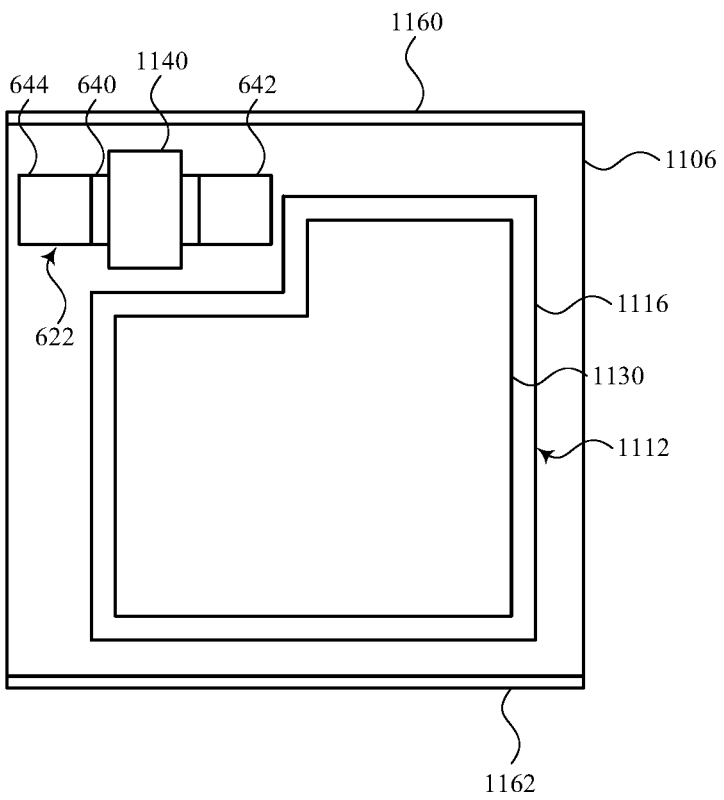

FIG. 11B shows a plan view of the photodetector 1112 and TFT 622. As shown, the photodetector 1112 may be sized to cover a substantially larger area than the TFT 622, thereby maximizing the electromagnetic radiation collecting ability of the photodetector 1112.

In some embodiments, a gate signal line 1160 connected to the gate 640 of the TFT 622 may be constructed to function as a hydrogen getter (e.g., as a Mo/Ti hydrogen getter, similarly to the oxide gate metal 1140). Other gate signal lines 1162 may also be constructed to function as hydrogen getters.

Figure 12A:
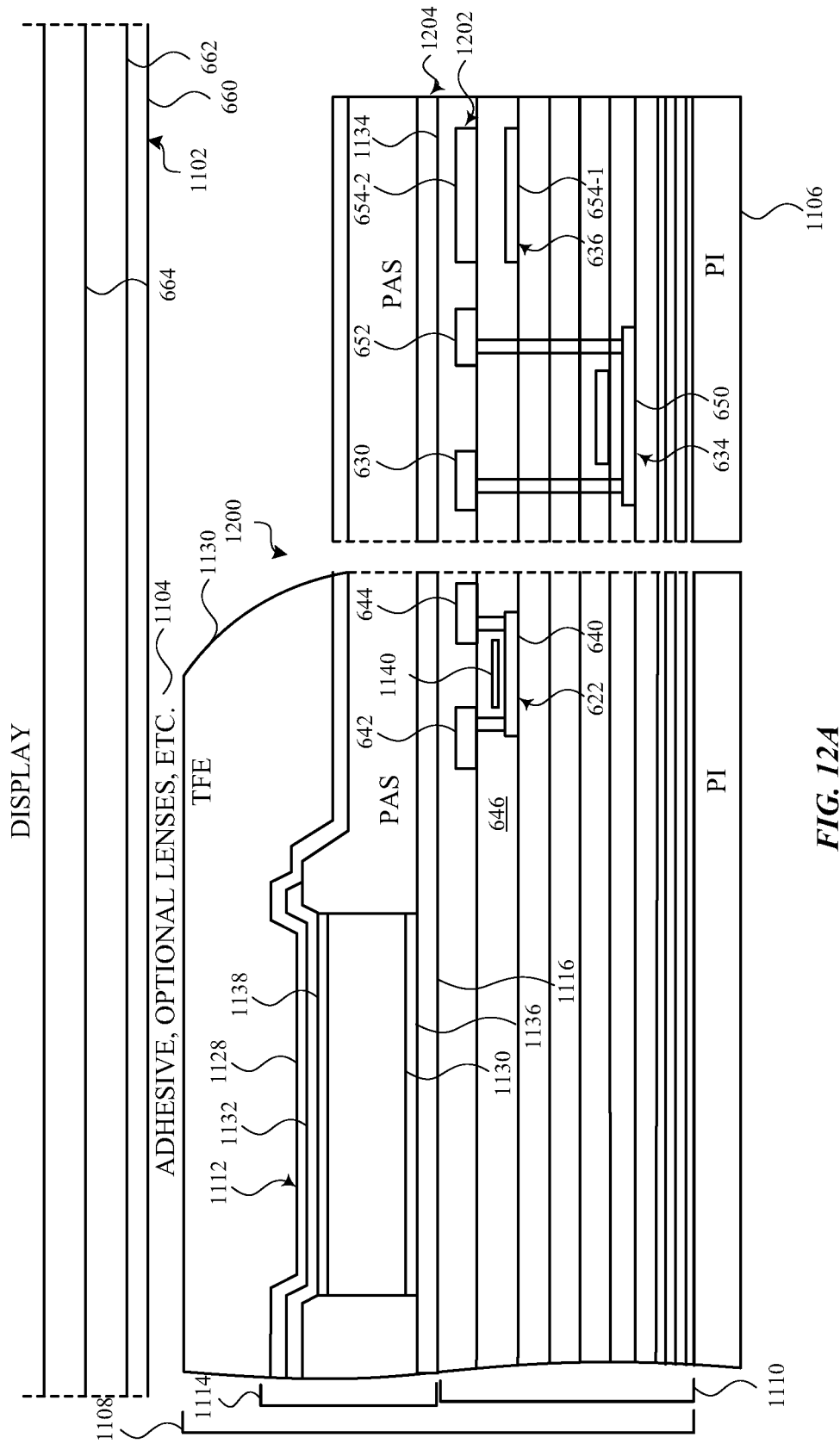
Figure 12B:
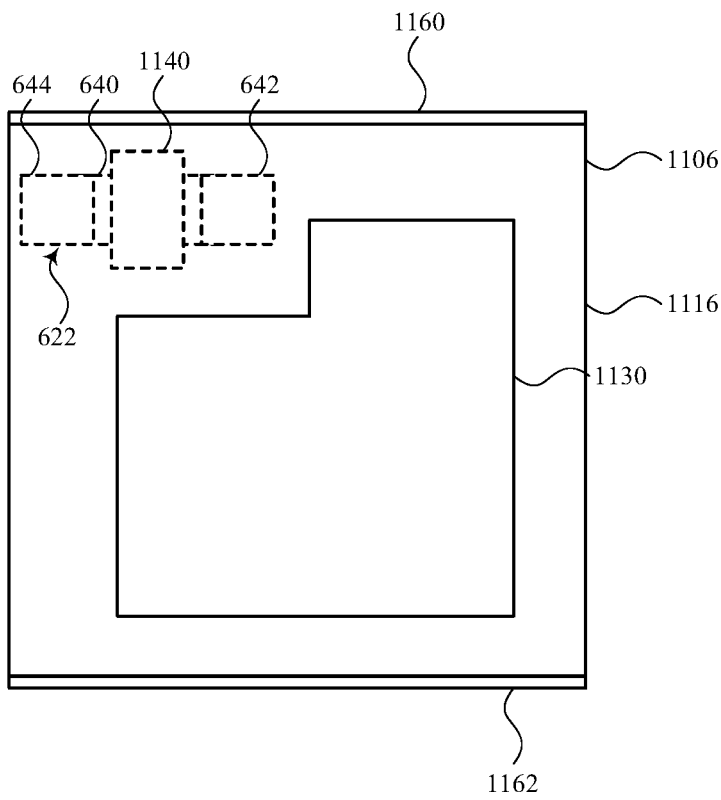

FIGS. 12A-12B show an alternative configuration for the sensor module described with reference to FIGS. 11A-11B. The sensor module 1200 shown in FIGS. 12A-12B differs from the sensor module described with reference to FIGS. 11A-11B in that the first and second sets of layers 1110, 1114 are disjoint and do not share an electrical contact layer. Instead, the first set of layers 1110 may have a metal layer 1202 that includes electrical contacts 642, 644, 630, 652 or conductors 654-2 for one or more TFTs or other components (e.g., a capacitor) included in the first set of layers 1110, and the second set of layers 1114 may have a metal layer 1204 that includes an electrode 1116 (or electrical contact, or anode) of the photodetector 1112. The electrode 1116 of the photodetector 1112 may extend over, but be electrically insulated from, the electrical contacts 642, 644 of the TFT 622. In this manner, the electrode 1116 may function as a hydrogen getter and mitigate or prevent the diffusion of hydrogen from the amorphous silicon 1130 of the photodetector 1112 to the oxide in which the gate of the TFT 622 is formed. The electrode 1116 may include Ti/Al/Ti layers, or Mo/Ti layers, or an Al alloy with a Ti layer on top that is sufficiently thick to absorb hydrogen that diffuses from the amorphous silicon 1130.

Figure 13:
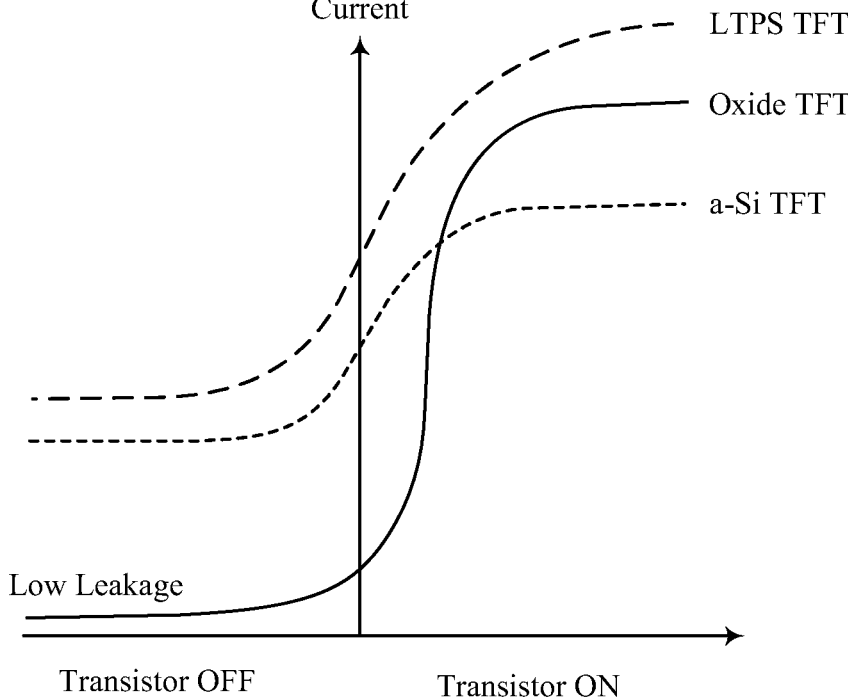

FIG. 13 shows current flow through the photodetector 1112 (an a-Si TFT), TFT 622 (an oxide TFT), and transistor 634 (an LTPS TFT) described with reference to FIGS. 11A-12B, as the various devices are switched from OFF to ON. As shown, the TFT 622, which is an oxide TFT device, has very low leakage current in its OFF state. Constructing the TFT 622 as an oxide TFT device therefore enables the photodetector's readout circuitry to be constructed using a passive pixel sensor (PPS) design (using one readout transistor) instead of an active pixel sensor (APS) design (using three transistors). This can increase readout speed, and increase signal-to-noise ratio (SNR). Implementing the TFT 622 as an oxide TFT device enables the TFT 622 to be made smaller (e.g., have a smaller width and length), while maintaining high mobility for electron-hole pairs, thereby enabling a reduction in the size of the TFT 622 versus a silicon-based TFT and enabling a higher fill ratio (i.e., a higher ratio of photodetector area to TFT 622 area). Further, the very low dark current of the oxide TFT 622, under reverse bias of a photodetector 1112 implemented as an a-Si PIN diode, can enable detection of much lower levels of electromagnetic radiation.

Figure 14:
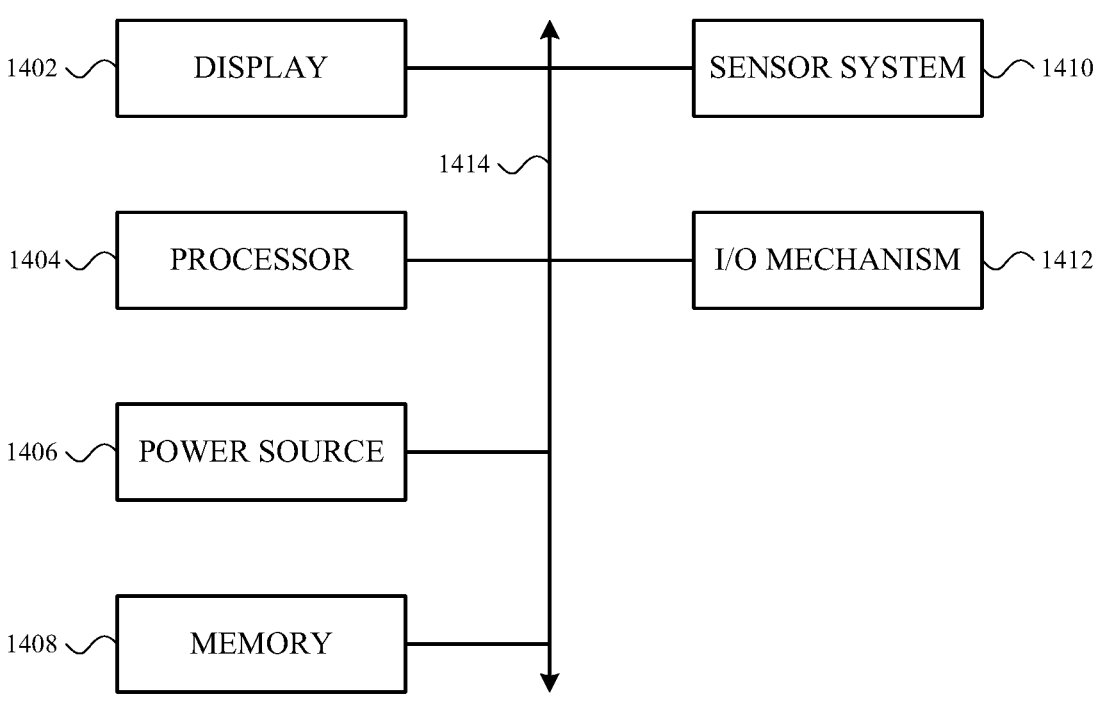
FIG. 14 shows a sample electrical block diagram of an electronic device, which electronic device may in some cases be implemented as any of the devices described with reference to FIGS. 1A-1B or 2A-2B.

FIG. 14 shows a sample electrical block diagram of an electronic device 1400, which electronic device may in some cases be implemented as one of the devices described with reference to FIGS. 1A-1B or 2A-2B, or as a device including the display described with one of FIGS. 3-12B. The electronic device 1400 may include an electronic display 1402 (e.g., a light-emitting display), a processor 1404, a power source 1406, a memory 1408 or storage device, a sensor system 1410, or an input/output (I/O) mechanism 1412 (e.g., an input/output device, input/output port, or haptic input/output interface). The processor 1404 may control some or all of the operations of the electronic device 1400. The processor 1404 may communicate, either directly or indirectly, with some or all of the other components of the electronic device 1400. For example, a system bus or other communication mechanism 1414 can provide communication between the electronic display 1402, the processor 1404, the power source 1406, the memory 1408, the sensor system 1410, and the I/O mechanism 1412.

The processor 1404 may be implemented as any electronic device capable of processing, receiving, or transmitting data or instructions, whether such data or instructions is in the form of software or firmware or otherwise encoded. For example, the processor 1404 may include a microprocessor, a central processing unit (CPU), an application-specific integrated circuit (ASIC), a digital signal processor (DSP), a controller, or a combination of such devices. As described herein, the term "processor" is meant to encompass a single processor or processing unit, multiple processors, multiple processing units, or other suitably configured computing element or elements. In some cases, the processor 1404 may provide part or all of the circuitry described with reference to any of FIGS. 1B, 3, 4A-4C, 5, 7, 8, and 10.

It should be noted that the components of the electronic device 1400 can be controlled by multiple processors. For example, select components of the electronic device 1400 (e.g., the sensor system 1410) may be controlled by a first processor and other components of the electronic device 1400 (e.g., the electronic display 1402) may be controlled by a second processor, where the first and second processors may or may not be in communication with each other.

The power source 1406 can be implemented with any device capable of providing energy to the electronic device 1400. For example, the power source 1406 may include one or more batteries or rechargeable batteries. Additionally or alternatively, the power source 1406 may include a power connector or power cord that connects the electronic device 1400 to another power source, such as a wall outlet.

The memory 1408 may store electronic data that can be used by the electronic device 1400. For example, the memory 1408 may store electrical data or content such as, for example, audio and video files, documents and applications, device settings and user preferences, timing signals, control signals, and data structures or databases. The memory 1408 may include any type of memory. By way of example only, the memory 1408 may include random access memory, read-only memory, Flash memory, removable memory, other types of storage elements, or combinations of such memory types.

The electronic device 1400 may also include one or more sensor systems 1410 positioned almost anywhere on the electronic device 1400. In some cases, the sensor systems 1410 may include one or more photodetectors, positioned as described with reference to any of FIGS. 1A-12B. The sensor system(s) 1410 may be configured to sense one or more type of parameters, such as but not limited to, vibration; light; touch; force; heat; movement; relative motion; biometric data (e.g., biological parameters) of a user; air quality; proximity; position; connectedness; matter type; and so on. By way of example, the sensor system(s) 1410 may include one or more of (or multiple of) a heat sensor, a position sensor, a proximity sensor, a light or optical sensor (e.g., an electromagnetic radiation emitter and/or detector), an accelerometer, a pressure transducer, a gyroscope, a magnetometer, a health monitoring sensor, and an air quality sensor, and so on. Additionally, the one or more sensor systems 1410 may utilize any suitable sensing technology, including, but not limited to, interferometric, magnetic, pressure, capacitive, ultrasonic, resistive, optical, acoustic, piezoelectric, or thermal technologies.

The I/O mechanism 1412 may transmit or receive data from a user or another electronic device. The I/O mechanism 1412 may include the electronic display 1402, a touch sensing input surface, a crown, one or more buttons (e.g., a graphical user interface "home" button), one or more cameras (including an under-display camera), one or more microphones or speakers, one or more ports such as a microphone port, and/or a keyboard. Additionally or alternatively, the I/O mechanism 1412 may transmit electronic signals via a communications interface, such as a wireless, wired, and/or optical communications interface. Examples of wireless and wired communications interfaces include, but are not limited to, cellular and Wi-Fi communications interfaces.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

As described above, one aspect of the present technology is the gathering and use of data available from various sources, including biometric data (e.g., the presence and/or proximity of a user to a device). The present disclosure contemplates that, in some instances, this gathered data may include personal information data that uniquely identifies or can be used to identify, locate, or contact a specific person. Such personal information data can include demographic data, location-based data, telephone numbers, email addresses, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to activate or deactivate various functions of the user's device, or gather performance metrics for the user's device or the user. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

What is claimed is:

1. An electronic device, comprising:
   a stack, including,
      a substrate; and
      a multi-layer structure deposited on the substrate and including a set of thin-film transistors (TFTs); and
   a photodetector attached to the multi-layer structure and defined by an organic photosensitive material that is electrically connected to a transistor in the set of TFTs, wherein the multi-layer structure comprises a Low-Temperature Polycrystalline Oxide (LTPO) organic light-emitting diode (OLED) display backplane.

2. The electronic device of claim 1, further comprising:
   a housing defining at least part of an interior volume and an opening into the interior volume;
   a cover mounted to the housing to cover the opening and further define the interior volume; and
   a display mounted within the interior volume and viewable through the cover;

wherein:

the stack is attached to a side of the display opposite the cover; and the photodetector is positioned to receive light through the display.

3. The electronic device of claim 2, further comprising at least one of a lens, an optical waveguide, an optical polarizer, or an optical film, positioned between the display and the stack.

4. The electronic device of claim 2, wherein:

the multi-layer structure including the set of TFTs is a first multi-layer structure including a first set of TFTs; and the display includes:

a second substrate;

a second multi-layer structure deposited on the second substrate and including a second set of TFTs; and an organic light-emitting material deposited on the second multi-layer structure and electrically connected to a set of drive transistors in the second set of TFTs.

5. The electronic device of claim 2, wherein the display comprises a bottom-emission liquid crystal display (LCD).

6. The electronic device of claim 1, wherein the organic photosensitive material forms a planarization layer of the multi-layer structure.

7. The electronic device of claim 6, wherein the planarization layer is a first planarization layer, the electronic device further comprising:

a second planarization layer between the first planarization layer and the set of TFTs.

8. The electronic device of claim 6, wherein:

the organic photosensitive material forms at least a first planarization layer and a second planarization layer of the multi-layer structure; and the electronic device further comprises an electrode positioned between the first planarization layer and the second planarization layer and electrically connected to the transistor.

9. The electronic device of claim 1, wherein the photodetector comprises an organic avalanche photodiode (O-APD).

10. An electronic device, comprising:

a stack, including, a substrate; and a multi-layer structure deposited on the substrate and including:

a first set of layers including a set of thin-film transistors (TFTs) and a TFT oxide layer; and a second set of layers including a PIN diode, the second set of layers distinct from the first set of layers; wherein:

the PIN diode is configured to operate as a photodetector and receive at least one wavelength of electromagnetic radiation;

the PIN diode is electrically connected to at least one TFT in the set of TFTs, the at least one TFT has a gate formed in the TFT oxide layer;

the PIN diode is electrically connected to an electrode comprising titanium; and the titanium operates as a hydrogen getter.

11. The electronic device of claim 10, wherein:

the first set of layers and the second set of layers share an electrical contact layer; and each of the PIN diode and the at least one TFT is connected to a respective electrical contact in the electrical contact layer.

12. The electronic device of claim 10, wherein the first set of layers further includes a silicon-based TFT.

13. The electronic device of claim 10, wherein the PIN diode is silicon-based.

14. The electronic device of claim 10, wherein the PIN diode is electrically connected to an electrode that extends over the at least one TFT.

\* \* \* \* \*